US 8,338,835 B2

(12) United States Patent
Miyake

(10) Patent No.: US 8,338,835 B2
(45) Date of Patent: Dec. 25, 2012

(54) DISPLAY DEVICE AND DRIVING METHOD THEREOF

(75) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 270 days.

(21) Appl. No.: 12/877,567

(22) Filed: Sep. 8, 2010

(65) Prior Publication Data

US 2011/0001545 A1   Jan. 6, 2011

Related U.S. Application Data

(62) Division of application No. 12/142,503, filed on Jun. 19, 2008, now Pat. No. 7,808,008.

(30) Foreign Application Priority Data

Jun. 29, 2007   (JP) ................................. 2007-171484

(51) Int. Cl.
   *H01L 31/14*   (2006.01)
(52) U.S. Cl. ............ 257/80; 257/E31.111; 257/E31.113
(58) Field of Classification Search ..................... 257/80, 257/290, 431, E33.053, E33.076, E31.096, 257/E31.111, E31.113
   See application file for complete search history.

(56) References Cited

U.S. PATENT DOCUMENTS

| | | | |
|---|---|---|---|
| 4,621,260 A | 11/1986 | Suzuki et al. | |
| 5,684,365 A | 11/1997 | Tang et al. | |
| 5,714,968 A | 2/1998 | Ikeda | |
| 5,870,071 A | 2/1999 | Kawahata | |
| 5,940,053 A | 8/1999 | Ikeda | |
| 5,956,011 A | 9/1999 | Koyama et al. | |
| 5,990,629 A | 11/1999 | Yamada et al. | |
| 6,011,529 A | 1/2000 | Ikeda | |
| 6,037,924 A | 3/2000 | Koyama et al. | |
| 6,175,345 B1 | 1/2001 | Kuribayashi et al. | |
| 6,229,508 B1 | 5/2001 | Kane | |

(Continued)

FOREIGN PATENT DOCUMENTS

JP   63-250873 A   10/1988

(Continued)

OTHER PUBLICATIONS

Tsutsui et al.; "Electroluminescence in Organic Thin Films"; Photochemical Processes in Organized Molecular Systems; 1991; pp. 437-450.

(Continued)

*Primary Examiner* — George Fourson, III
(74) *Attorney, Agent, or Firm* — Fish & Richardson P.C.

(57) ABSTRACT

A display device in which not only a variation in a current value due to a threshold voltage but also a variation in a current value due to mobility are prevented from influencing luminance with respect to all the levels of grayscale to be displayed. After applying an initial potential for correction to a gate and a drain of a driving transistor, the gate and the drain of the driving transistor is kept connected in a floating state, and a voltage is held in a capacitor before a voltage between the gate and a source of the driving transistor becomes equal to a threshold voltage. When a voltage obtained by subtracting the voltage held in the capacitor from a voltage of a video signal is applied to the gate and the source of the driving transistor, a current is supplied to a light-emitting element. A value of an initial voltage for correction differs in accordance with the voltage of the video signal.

12 Claims, 17 Drawing Sheets

U.S. PATENT DOCUMENTS

| | | |
|---|---|---|
| 6,246,180 B1 | 6/2001 | Nishigaki |
| 6,310,598 B1 | 10/2001 | Koyama et al. |
| 6,356,029 B1 | 3/2002 | Hunter |
| 6,362,798 B1 | 3/2002 | Kimura et al. |
| 6,373,455 B1 | 4/2002 | Kuribayashi et al. |
| 6,384,804 B1 | 5/2002 | Dodabalapur et al. |
| 6,475,845 B2 | 11/2002 | Kimura |
| 6,518,962 B2 | 2/2003 | Kimura et al. |
| 6,525,704 B1 | 2/2003 | Kondo et al. |
| 6,583,775 B1 | 6/2003 | Sekiya et al. |
| 6,608,613 B2 | 8/2003 | Koyama et al. |
| 6,611,130 B2 | 8/2003 | Chang |
| 6,677,713 B1 | 1/2004 | Sung |
| 6,680,580 B1 | 1/2004 | Sung |
| 6,697,057 B2 | 2/2004 | Koyama et al. |
| 6,714,178 B2 | 3/2004 | Koyama et al. |
| 6,730,966 B2 | 5/2004 | Koyama |
| 6,734,636 B2 | 5/2004 | Sanford et al. |
| 6,737,813 B2 | 5/2004 | Kawasaki et al. |
| 6,768,348 B2 | 7/2004 | Shionoiri et al. |
| 6,781,153 B2 | 8/2004 | Anzai |
| 6,784,454 B2 | 8/2004 | Anzai |
| 6,798,405 B2 | 9/2004 | Anzai |
| 6,798,452 B1 | 9/2004 | Kuroda et al. |
| 6,828,950 B2 | 12/2004 | Koyama |
| 6,839,057 B2 | 1/2005 | Iguchi |
| 6,859,193 B1 | 2/2005 | Yumoto |
| 6,876,346 B2 | 4/2005 | Anzai et al. |
| 6,928,136 B2 | 8/2005 | Nagao et al. |
| 6,950,082 B2 | 9/2005 | Sung et al. |
| 6,954,194 B2 | 10/2005 | Matsumoto et al. |
| 6,958,489 B2 | 10/2005 | Kimura |
| 6,958,750 B2 | 10/2005 | Azami et al. |
| 6,975,142 B2 | 12/2005 | Azami et al. |
| 6,982,462 B2 | 1/2006 | Koyama |
| 7,012,290 B2 | 3/2006 | Kimura |
| 7,068,076 B2 | 6/2006 | Azami |
| 7,091,750 B2 | 8/2006 | Shionoiri et al. |
| 7,122,835 B1 | 10/2006 | Ikeda et al. |
| 7,129,917 B2 | 10/2006 | Yamazaki et al. |
| 7,151,278 B2 | 12/2006 | Nagao et al. |
| 7,158,105 B2 | 1/2007 | Miyazawa |
| 7,167,406 B2 | 1/2007 | Komiya |
| 7,173,584 B2 | 2/2007 | Kimura et al. |
| 7,173,590 B2 | 2/2007 | Uchino et al. |
| 7,193,591 B2 | 3/2007 | Yumoto |
| 7,196,681 B2 | 3/2007 | Okuda |
| 7,317,434 B2 | 1/2008 | Lan et al. |
| 7,327,357 B2 | 2/2008 | Jeong |
| 7,358,942 B2 | 4/2008 | Yamazaki et al. |
| 7,365,713 B2 | 4/2008 | Kimura |
| 7,379,039 B2 | 5/2008 | Yumoto |
| 7,388,564 B2 | 6/2008 | Yumoto |
| 7,414,599 B2 | 8/2008 | Chung et al. |
| 7,429,985 B2 | 9/2008 | Kimura et al. |
| 7,443,367 B2 | 10/2008 | Numao |
| 7,456,810 B2 | 11/2008 | Kimura |
| 7,477,218 B2 | 1/2009 | Koga et al. |
| 7,502,001 B2 | 3/2009 | Fish et al. |
| 7,535,442 B2 | 5/2009 | Yamashita et al. |
| 7,564,433 B2 | 7/2009 | Hector et al. |
| 7,575,961 B2 | 8/2009 | Ikeda et al. |
| 7,605,789 B2 | 10/2009 | Uchino et al. |
| 7,714,816 B2 | 5/2010 | Umezaki |
| 7,821,478 B2 | 10/2010 | Tsuchida |
| 2001/0024186 A1 | 9/2001 | Kane et al. |
| 2002/0070913 A1 | 6/2002 | Kimura et al. |
| 2003/0090481 A1 | 5/2003 | Kimura |
| 2003/0103022 A1 | 6/2003 | Noguchi et al. |
| 2003/0132931 A1 | 7/2003 | Kimura et al. |
| 2003/0214245 A1 | 11/2003 | Yamazaki et al. |
| 2004/0080474 A1 | 4/2004 | Kimura |
| 2004/0174349 A1 | 9/2004 | Libsch et al. |
| 2004/0174354 A1 | 9/2004 | Ono et al. |
| 2004/0232842 A1 | 11/2004 | Inoue |
| 2004/0263506 A1 | 12/2004 | Koyama et al. |
| 2005/0012686 A1 | 1/2005 | Osame et al. |
| 2005/0093804 A1 | 5/2005 | Yamazaki et al. |
| 2005/0253531 A1 | 11/2005 | Matsumoto et al. |
| 2006/0033161 A1 | 2/2006 | Koyama |
| 2006/0077134 A1 | 4/2006 | Hector et al. |
| 2006/0082528 A1 | 4/2006 | Guo et al. |
| 2006/0092185 A1 | 5/2006 | Jo et al. |
| 2006/0170628 A1 | 8/2006 | Yamashita et al. |
| 2006/0197116 A1 | 9/2006 | Kimura |
| 2006/0255837 A1 | 11/2006 | Shionoiri et al. |
| 2006/0256047 A1 | 11/2006 | Kimura et al. |
| 2006/0267884 A1 | 11/2006 | Takahashi et al. |
| 2007/0063993 A1 | 3/2007 | Shishido |
| 2007/0064469 A1 | 3/2007 | Umezaki |
| 2007/0076496 A1 | 4/2007 | Komiya |
| 2007/0080909 A1 | 4/2007 | Jeon et al. |
| 2007/0085847 A1 | 4/2007 | Shishido |
| 2007/0091029 A1 | 4/2007 | Uchino et al. |
| 2007/0103419 A1 | 5/2007 | Uchino et al. |
| 2007/0115225 A1 | 5/2007 | Uchino et al. |
| 2007/0126664 A1 | 6/2007 | Kimura |
| 2007/0126665 A1 | 6/2007 | Kimura |
| 2007/0132694 A1 | 6/2007 | Uchino et al. |
| 2007/0164962 A1 | 7/2007 | Uchino et al. |
| 2007/0210720 A1 | 9/2007 | Kimura |
| 2007/0236424 A1 | 10/2007 | Kimura |
| 2007/0247398 A1 | 10/2007 | Nathan et al. |
| 2007/0268210 A1 | 11/2007 | Uchino et al. |
| 2008/0225061 A1 | 9/2008 | Kimura et al. |
| 2008/0284312 A1 | 11/2008 | Kimura |
| 2008/0316152 A1 | 12/2008 | Kimura et al. |
| 2009/0009676 A1 | 1/2009 | Kimura et al. |
| 2009/0051674 A1 | 2/2009 | Kimura et al. |
| 2009/0096727 A1 | 4/2009 | Kimura |
| 2009/0225010 A1 | 9/2009 | Kimura |

FOREIGN PATENT DOCUMENTS

| | | |
|---|---|---|
| JP | 04-328791 A | 11/1992 |
| JP | 2000-122607 A | 4/2000 |
| JP | 2000-284749 A | 10/2000 |
| JP | 2001-083924 A | 3/2001 |
| JP | 2005-141195 A | 6/2005 |
| JP | 2005-164894 A | 6/2005 |
| JP | 2005-189643 A | 7/2005 |
| JP | 2005-195756 A | 7/2005 |
| JP | 2005-202255 A | 7/2005 |
| JP | 2006-017968 A | 1/2006 |
| JP | 2006-084899 A | 3/2006 |
| JP | 2006-119180 A | 5/2006 |
| JP | 2006-208966 A | 8/2006 |
| JP | 2006-215275 A | 8/2006 |
| JP | 2006-227237 A | 8/2006 |
| JP | 2006-227238 A | 8/2006 |
| JP | 2006-227239 A | 8/2006 |
| JP | 2006-243525 A | 9/2006 |
| JP | 2006-243526 A | 9/2006 |
| JP | 2006-251631 A | 9/2006 |
| JP | 2007-148128 A | 6/2007 |
| JP | 2007-171827 A | 7/2007 |

OTHER PUBLICATIONS

Baldo et al.; "Highly Efficient Phosphorescent Emission From Organic Electroluminescent Devices"; Nature; Sep. 10, 1998; pp. 151-154; vol. 395.

Baldo et al.; "Very High-Efficiency Green Organic Light-Emitting Devices Based on Electrophosphorescence"; Applied Physics Letters; Jul. 5, 1999; pp. 4-6; vol. 75, No. 1.

Tsutsui et al.; "High Quantum Efficiency in Organic Light-Emitting Devices with Iridium-Complex as a Triplet Emissive Center"; Japanese Journal of Applied Physics; Dec. 15, 1999; pp. L1502-L1504; vol. 38, No. 12B.

Kanicki et al.; "Amorphous Silicon Thin-Film Transistors Based Active-Matrix Organic Light-Emitting Displays"; Asia Display / IDW '01; 2001; pp. 315-318.

Jung et al.; "A 14.1 inch Full Color AMOLED Display with Top Emission Structure and a-Si TFT Backplane"; SID 05 Digest (SID International Symposium Digest of Technical Papers); 2005; pp. 1538-1541; vol. 36.

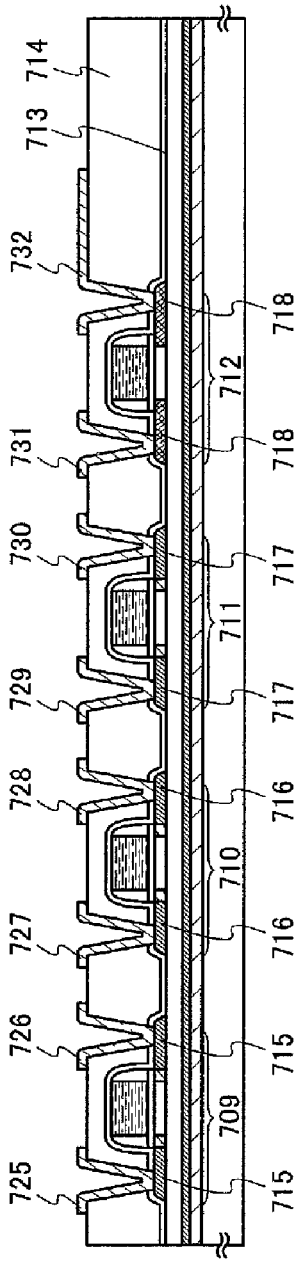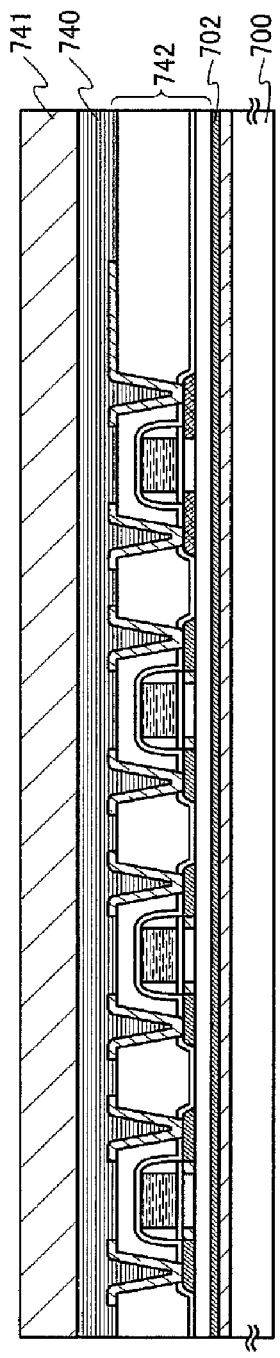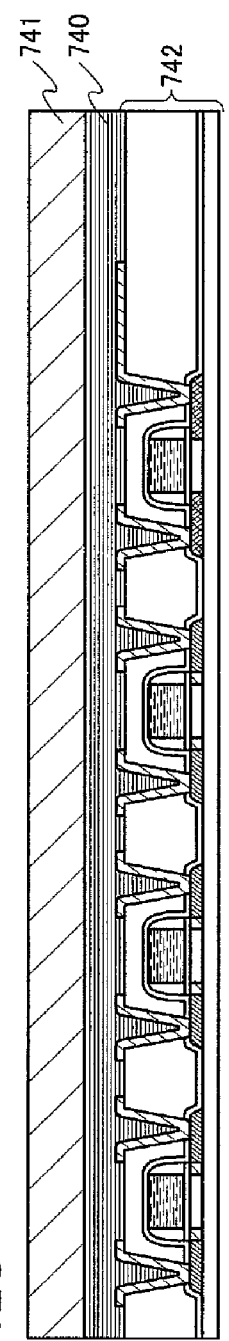

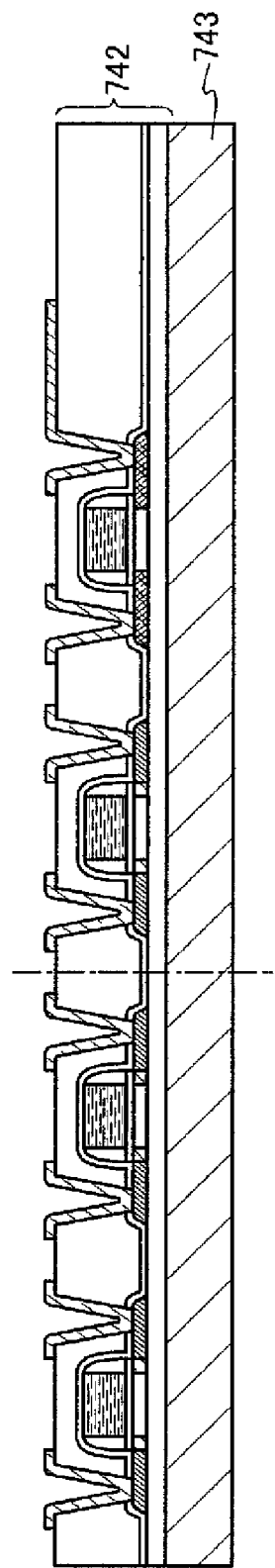
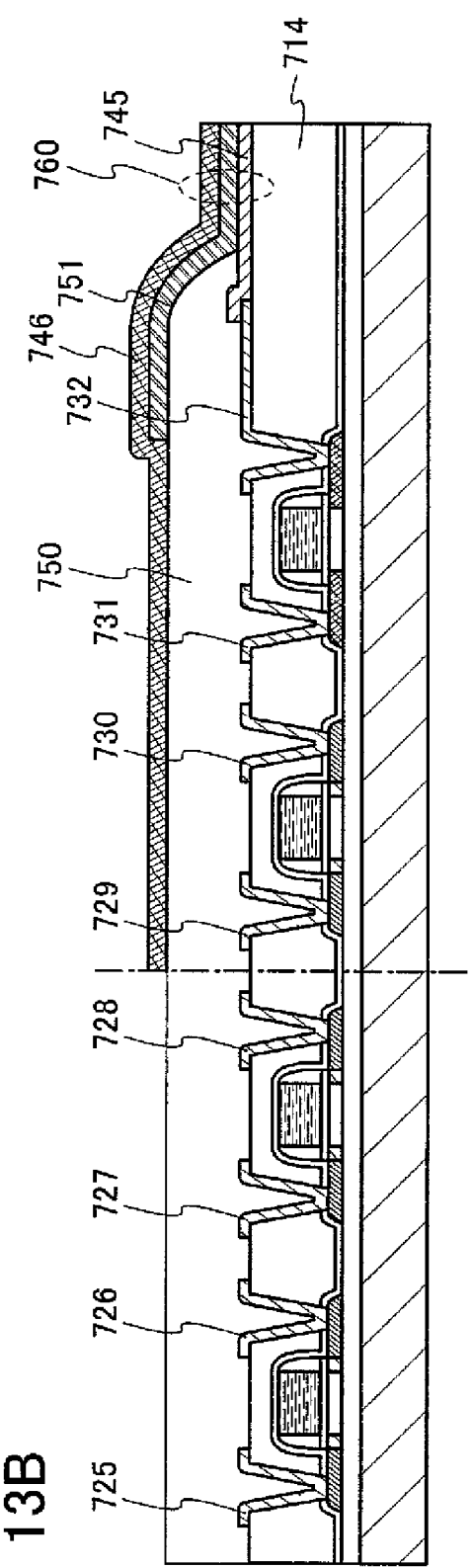
FIG. 13A
FIG. 13B

DISPLAY DEVICE AND DRIVING METHOD THEREOF

CROSS-REFERENCE TO RELATED APPLICATIONS

This application is a divisional of U.S. application Ser. No. 12/142,503, filed Jun. 19, 2008, now allowed, which claims the benefit of a foreign priority application filed in Japan as Serial No. 2007-171484 on Jun. 29, 2007, both of which are incorporated by reference.

BACKGROUND OF THE INVENTION

1. Field of the Invention

The present invention relates to a display device in which a transistor is provided for each pixel and a driving method thereof.

2. Description of the Related Art

Since display devices using light-emitting elements have high visibility, are suitable for reduction in thickness, and do not have limitations on viewing angles, they have attracted attention as display devices which can take the place of CRTs (cathode ray tubes) or liquid crystal display devices. Specifically proposed structures of active matrix display devices using light-emitting elements are different depending on manufacturers. However, in general, at least a light emitting element, a transistor (a switching transistor) which controls input of video signals to pixels, and a transistor (a driving transistor) which controls value of current supplied to the light-emitting elements are provided for each pixel.

On the other hand, thin film transistors have an advantage that the thin film transistors can be formed over glass substrates which are inexpensive while the thin film transistors have a disadvantage that characteristics such as a threshold voltage and a mobility are likely to vary compared to bulk transistors. Since the value of a current which flows through driving transistors relates to values of a threshold voltage and mobility, variations in mobility and the threshold voltage are reflected to luminance of light-emitting elements in consequence. Therefore, it is an important object to propose a driving method for improving the image quality of display devices in which current value of driving transistors can be corrected in expectation of variations in the threshold voltage and mobility.

In Patent Document 1 (Japanese Published Patent Application No. 2006-084899), a driving method for a display device, in which not only the threshold voltage but also mobility can be corrected, has been proposed. In the driving method disclosed in Patent Document 1, during a detection period, a potential difference between a gate and a source of a drive transistor which corresponds to a driving transistor is held in a capacitor portion before the potential difference becomes equal to the threshold voltage. With the above-described structure, not only a variation in the threshold voltage but also a variation in the mobility can be prevented from influencing luminance.

SUMMARY OF THE INVENTION

However, in the driving method disclosed in Patent Document 1, although a fluctuation in the current value due to a variation in the threshold voltage is corrected so as to be canceled, the fluctuation in the current value of the driving transistor due to a variation in mobility is corrected in directions of cancellation at just some level. That is, in the driving method described above, the fluctuation in the current value of the driving transistor due to the variation in the mobility is not corrected adequately to be canceled. Hereinafter, this will be described specifically.

A current $I_d$ which flows through a light-emitting element is represented by $k\mu(Vgs-Vth)^2/2$. Note that k is a constant determined in accordance with the channel length, channel width, and gate capacitance of a driving transistor; Vgs of the driving transistor corresponds to a potential difference between a gate and a source of the driving transistor; and Vth corresponds to the threshold voltage of the driving transistor. Therefore, in the case where correction is not performed, as mobility $\mu$ increases, the current Id which flows through the light-emitting element also increases, whereas as the mobility $\mu$ decreases, the current Id which flows through the light-emitting element also decreases. In the case of the driving method disclosed in Patent Document 1, during the detection period, a voltage Va generated between the gate and the source of the driving transistor has a value which is obtained by adding an offset voltage Vb to the threshold voltage Vth. During a light-emitting period which comes after the detection period, a value which is obtained by subtracting the voltage Va from a voltage Vsig of a video signal is the gate voltage Vgs of the driving transistor. Therefore, the current Id during the light-emitting period is represented by $k\mu(Vsig-Va-Vth)^2/2$. Note that the voltage Va is represented by Vb−Vth and the current Id is represented by Formula 1 below.

$$Id=k\mu(Vsig-Vb)^2/2 \qquad \text{(Formula 1)}$$

According to Formula 1, it is apparent that the fluctuation in the current value due to the variation in the threshold voltage Vth is canceled even if the threshold voltage Vth varies. On the other hand, the offset voltage Vb has a negative value when the driving transistor is a p-channel transistor, and the smaller the mobility $\mu$ becomes, the larger an absolute value of the offset voltage Vb becomes, whereas the larger the mobility $\mu$ becomes, the smaller the absolute value of the offset voltage Vb becomes. Therefore, Vb functions as a correction term for correcting a variation in the current Id due to the mobility $\mu$ during the light-emitting period; a decrease in the current Id can be suppressed even if the mobility $\mu$ decreases, whereas an increase in the current Id can be suppressed even if the mobility $\mu$ increases.

When the current Id which flows through the driving transistor during the detection period is denoted by Iref, the offset voltage Vb is represented by $\{2/\text{ref}/(k\mu)\}^{1/2}+Vth$. That is, although Vb functions as the correction term as described above, Vb does not completely correct the variation. In the case where a high level of grayscale is displayed, a difference between the potential Vsig and a reference potential is big and a coefficient of the mobility $\mu$ becomes large in Formula 1. Therefore, the fluctuation of the current value is effectively corrected by the correction term. However, in the case where a low level of grayscale is displayed, because of the correction term Vb which is not influenced by the potential Vsig, the current Id does not converge on 0 even if the difference between the potential Vsig and the reference potential becomes small. Therefore, in the case where a low level of grayscale is displayed, there is a problem in that a variation in luminance is caused by the mobility $\mu$ due to the correction term.

In view of the above-mentioned problems, an object of the present invention is to prevent luminance from being influenced by not only a variation in a current value due to a threshold voltage but also a variation in the current value due to mobility.

In order to correct not only a variation in the current value due to the threshold voltage but also a variation in the current value due to mobility, with respect to all the levels of grayscale, the present invention is driven as changing the value of a correction term in accordance with the value of a potential of a video signal. That is, when a high level of grayscale is displayed, an absolute value of a correction term of mobility μ is increased, whereas the absolute value of the correction term of the mobility μ is decreased when a low level of grayscale is displayed.

Specifically, in a driving method of the present invention, after a potential for resetting (an initial potential for correction) is applied to a gate and a drain of a driving transistor, the gate and the drain of the driving transistor are kept connected and set to be in a floating state for a given period, so that a voltage (a voltage for correction) which functions as a correction term for correcting the threshold voltage and mobility is generated between the gate and a source of the driving transistor. The voltage for correction is held in a capacitor. The given period for obtaining the voltage for correction is a period from a time when the gate and the drain of the driving transistor to which the initial potential for correction is applied comes to be in a floating state to a time before a potential difference between the gate and the source of the driving transistor becomes equal to the threshold voltage. The value of the voltage for correction is set to be varied in accordance with a potential of a video signal which is to be input to a pixel. That is, in the case where a difference between the following potential of the video signal to be input and a reference potential is big, an initial potential for correction which makes the absolute value of the voltage for correction large is applied to a pixel; and in the case where the difference between the potential of the video signal to be input to the pixel and the reference potential is small, the initial potential for correction which makes the absolute value of the voltage for correction small is applied to the pixel. With the above-described structure, when a high level of grayscale is displayed, the difference between the potential of the video signal and the reference potential is big, whereby the absolute value of the voltage for correction is also large. When a low level of grayscale is displayed, the difference between the potential of the video signal and the reference potential is small, whereby the absolute value of the voltage for correction is also small. After the voltage for correction is obtained, when grayscale is displayed in response to the video signal, a potential obtained by subtracting the voltage for correction from the potential of the video signal is applied to the gate of the driving transistor. A current which corresponds to a gate voltage of the driving transistor is supplied to a light-emitting element and the grayscale is displayed.

In order to perform the above-described driving method, in a display device of the present invention, a pixel includes at least a light-emitting element, a transistor (a switching transistor) configured to sample a video signal, a transistor (driving transistor) configured to control a value of a current supplied to the light-emitting element, a transistor configured to control connection between a gate and a drain of the driving transistor, a transistor configured to control application of an initial potential for correction to the gate of the driving transistor, a transistor configured to select whether the drain of the driving transistor is set to be in a floating state or not, and a capacitor for holding a voltage between the gate and a source of the driving transistor. Further, the display device of the present invention includes a driver circuit configured to determine the initial potential for correction in accordance with the sampled potential of the video signal and to input the initial potential for correction to the pixel.

In the present invention, with the above-described structure, the value of a voltage for correction which functions as a correction term is changed in accordance with a potential of a video signal. That is, when a high level of grayscale is displayed, an initial potential for correction which makes the absolute value of the voltage for correction large is applied to a pixel; and when a low level of grayscale is displayed, the initial potential for correction which makes the absolute value of the voltage for correction small is applied to the pixel. In this manner, when a value of the voltage for correction is changed in accordance with the potential of the video signal, correction can be performed so as to make a current Id closer to 0 even when the level of grayscale is lowered, that is, even when a difference between the potential of the video signal and a reference potential is small. Therefore, not only in the case where a high level of grayscale is displayed but also in the case where a low level of grayscale is displayed, a fluctuation in a current value of a driving transistor due to a variation in mobility can be suppressed, so that a variation in luminance due to the fluctuation can be suppressed.

Therefore, the present invention can adequately prevent not only a variation in a current value due to the threshold voltage but also a variation in a current value due to mobility from influencing luminance, with respect to all the levels of grayscale to be displayed.

BRIEF DESCRIPTION OF THE DRAWINGS

In the accompanying drawings;

FIGS. 12A to 12C are diagrams illustrating the manufacturing method of the display device of the present invention;

FIGS. 13A and 13B are diagrams illustrating the manufacturing method of the display device of the present invention;

DETAILED DESCRIPTION OF THE INVENTION

Hereinafter, embodiment modes of the present invention will be described with reference to the drawings. However, the present invention can be embodied in many different modes and it is easily understood by those skilled in the art that modes and details can be variously changed without departing from the scope and the spirit of the present invention. Therefore, the present invention should not be limited to the descriptions of the embodiment modes below.
(Embodiment Mode 1)

Figure 1A:
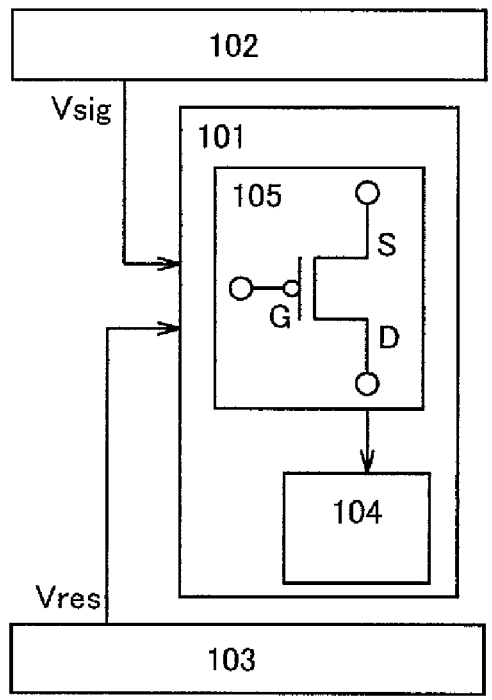
FIG. 1A is block diagram illustrating a structure of a display device and FIG. 1B is a circuit diagram of a pixel included in a display device of the present invention.

FIG. 1A is a block diagram of a display device of the present invention. The display device of the present invention includes a pixel 101, a signal line driver circuit 102 which applies a potential Vsig of a video signal to the pixel 101, and a reset line driver circuit 103 which applies an initial potential Vres for correction to the pixel 101 before the potential Vsig of the video signal is applied to the pixel 101. The pixel 101 includes at least a light-emitting element 104 which displays grayscale in accordance with a value of a current supplied and a driving transistor 105 which controls the value of the current supplied to the light-emitting element 104.

The initial potential Vres for correction applied to the pixel 101 is applied to a gate (G) and a drain (D) of the driving transistor 105. In addition, a potential which is obtained by subtracting a voltage for correction obtained by the initial potential Vres for correction from the potential Vsig of the video signal applied to the pixel 101 is applied to the gate (G) of the driving transistor 105. In accordance with voltages of the gate (G) and a source (S) of the driving transistor 105, the driving transistor 105 controls the value of the current to be supplied to the light emitting element 104.

Note that in FIG. 1A, although a case where the driving transistor 105 is a p-channel transistor is illustrated, the present invention is not limited thereto. The driving transistor 105 may be an n-channel transistor.

Figure 1B:
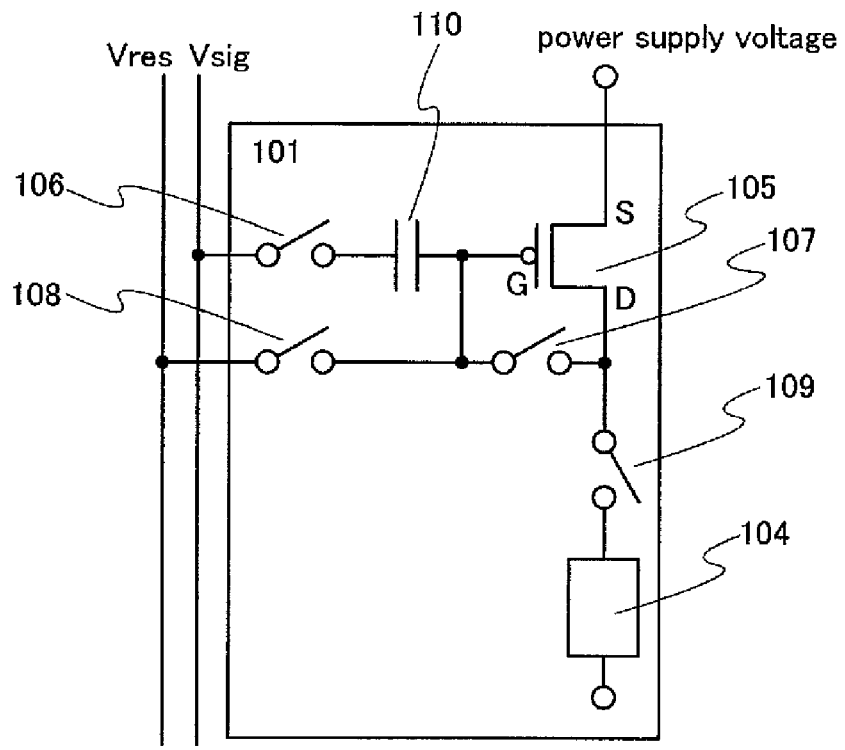

FIG. 1B is a circuit diagram illustrating a more specific structure of the pixel 101 in the case where the driving transistor 105 is the p-channel transistor. The pixel 101 includes at least a switching transistor 106 which samples the video signal having the potential Vsig, a transistor 107 which controls connection between a gate and a drain of the driving transistor 105, a transistor 108 which controls application of the initial potential Vres for correction to the gate of the driving transistor 105, a transistor 109 which selects whether the drain of the driving transistor 105 is set to be in a floating state or not, and a capacitor 110 for holding a voltage between the gate and a source of the driving transistor 105, in addition to the light-emitting element 104 and the driving transistor 105.

In FIG. 1B, the switching transistor 106 and the transistors 107 to 109 are simply shown as switches. Note that each of the switching transistor 106 and the transistor 107 to 109 functions as a switching device. Therefore, as each of the switching transistor 106 and the transistors 107 to 109, a plurality of transistors may be used instead of a single transistor, or other switching devices may be used. Switching devices are devices which can control a resistance value between two terminals or select conduction or non-conduction between two terminals.

In the display device of the present invention, a thin film transistor which includes an amorphous semiconductor film, a polycrystalline semiconductor film, or a microcrystalline semiconductor film as an active layer can be used. Alternatively, a thin film transistor which includes an SOI (silicon on insulator) as an active layer can be used.

Next, operations of the pixel 101 included in the display device of the present invention will be described with reference to FIGS. 2A to 2C. Operations of the display device of the present invention can be divided into an operation of initializing charge held in the capacitor 110 by using the initial potential Vres for correction, an operation of holding the voltage Vr for correction obtained by the initial potential Vres for correction in the capacitor 110, and an operation of displaying grayscale by the light-emitting element 104 by using the potential Vsig of the video signal.

First, the operation of initializing the charge held in the capacitor 110 will be described. In the pixel 101, during a period (an initialization period) of initializing the charge held in the capacitor 110, the switching transistor 106 is turned on, the transistor 107 is turned on, the transistor 108 is turned on, and the transistor 109 is turned off. Then, a power supply potential VDD is applied to the source of the driving transistor 105. The power supply potential VDD is also applied to one of electrodes of the capacitor 110 through the switching transistor 106.

Figure 2A:
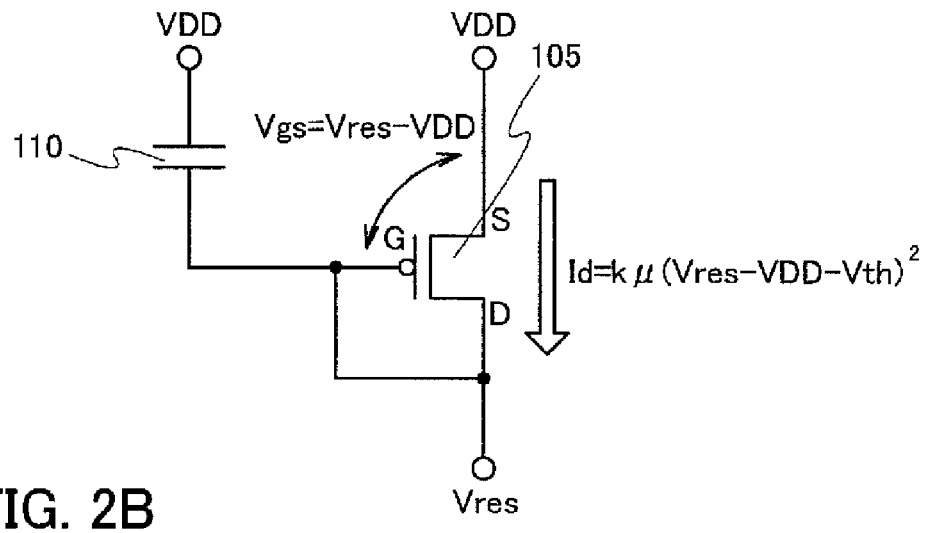
FIGS. 2A to 2C are diagrams illustrating configurations of connections in a pixel in respective periods.

FIG. 2A shows a relation of connection between the driving transistor 105 and the capacitor 110 in the pixel 101 shown in FIG. 1B during the initialization period. As shown in FIG. 2A, during the initialization period, the gate and the drain of the driving transistor 105 are connected to each other and the initial potential Vres for correction is applied to the gate and the drain of the driving transistor 105. In addition, the power supply potential VDD is applied to the one electrode of the capacitor 110. The gate of the driving transistor 105 is connected to the other electrode of the capacitor 110 and the initial potential Vres for correction is applied to the gate of the driving transistor 105 and the other electrode of the capacitor 110.

Note that in this embodiment mode, since the case where the driving transistor 105 is a p-channel transistor is shown, the power supply potential VDD (VDD>Vres) is employed. In the case where the driving transistor 105 is an n-channel transistor, the power supply potential VSS (Vres>VSS) is employed.

In the present invention, the value of the initial potential Vres for correction is changed in accordance with the value of the potential Vsig of the video signal applied to the pixel 101 in a following display period. That is, in the case where a high level of grayscale is displayed, the initial potential for correction which makes the absolute value of the voltage Vr for correction large is applied to the pixel; and in the case where a low level of grayscale is displayed, the initial potential for correction which makes the absolute value of the voltage Vr for correction small is applied to the pixel.

A voltage (a gate voltage) Vgs between the gate and the source of the driving transistor 105 during the initialization period is (Vres−VDD). In addition, a drain current Id of the driving transistor 105 is obtained by Formula 2 below. Note that k is a constant determined in accordance with the channel length, the channel width, and the gate capacitance of the driving transistor 105, μ corresponds to the mobility of the driving transistor 105 and Vth corresponds to the threshold voltage of the driving transistor 105.

$$Id = k\mu(Vres - VDD - Vth)^2 \qquad \text{(Formula 2)}$$

Next, the operation of holding the voltage Vr for correction in the capacitor 110 will be described. In the pixel 101, during a period (a correction period) of holding the voltage Vr in the capacitor 110, the switching transistor 106 is turned on, the transistor 107 is turned on, the transistor 108 is turned off, and the transistor 109 is turned off. Then, the power supply potential VDD is applied to the source of the driving transistor 105. The power supply potential VDD is also applied to the one of electrodes of the capacitor 110 through the switching transistor 106.

Figure 2B:
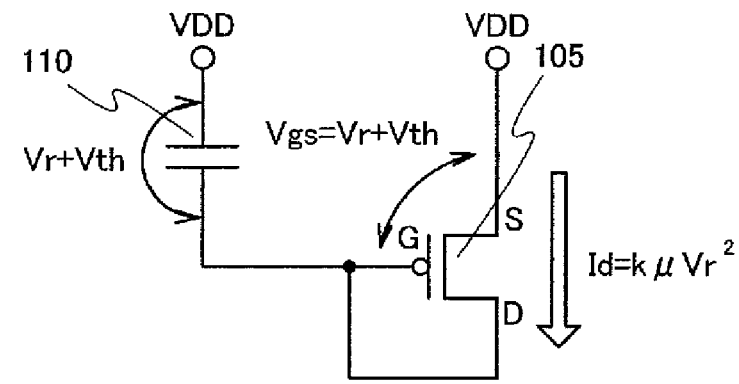

FIG. 2B shows a relation of connection between the driving transistor 105 and the capacitor 110 in the pixel 101 shown in FIG. 1B during the correction period. As shown in FIG. 2B, during the correction period, the gate and the drain of the driving transistor 105 are connected to each other and are in a floating state. In addition, the power supply potential VDD is applied to the one of electrodes of the capacitor 110. The gate of the driving transistor 105 is connected to the other electrode of the capacitor 110.

During the correction period, since the gate and the drain of the driving transistor 105 are in a floating state, the drain current of the driving transistor 105 gradually approaches to 0. When the correction period is long enough, the gate voltage Vgs of the driving transistor 105 ultimately converges on the threshold voltage Vth. However, in the present invention, before the drain current becomes 0, that is, before the gate voltage Vgs converges on the threshold voltage Vth, the transistor 107 is turned off and the gate and the drain of the driving transistor 105 are disconnected to finish the correction period. Then, a voltage between the gate and the source of the driving transistor 105 when the correction period is over, that is, the voltage obtained by adding the voltage Vr for correction to the threshold voltage Vth is held in the capacitor 110.

Figure 3:
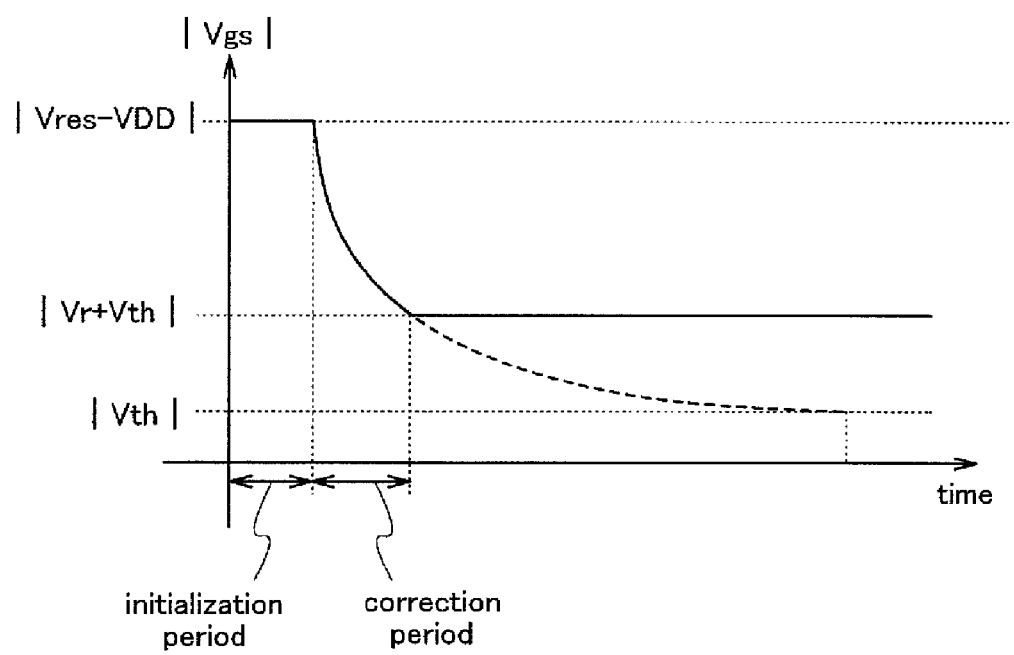
FIG. 3 is a diagram illustrating a time change of a gate voltage Vgs.

FIG. 3 shows a time change of the gate voltage Vgs when the gate and the drain of the driving transistor 105 are in a floating state after the initialization period. As shown in FIG. 3, the gate voltage of the driving transistor 105 during the initialization period is |Vgs|=|Vres−VDD|. After the initialization period is over, when the gate and the drain of the driving transistor 105 come to be in a floating state, |Vgs| gradually decreases to be closer to |Vth|, as represented by a solid line. In the present invention, before |Vgs| converges on |Vth| as represented by a dashed line, the correction period is over when |Vgs|=|Vr+Vth| and the transistor 107 is turned off. Therefore, the absolute value of the gate voltage Vgs held in the capacitor 110 is |Vr+Vth|. In addition, the drain current Id of the driving transistor 105 is represented by Formula 3 below.

$$Id=k\mu Vr^2 \quad \text{(Formula 3)}$$

Further, in the present invention, the value of the initial potential Vres for correction is changed in accordance with the value of the potential Vsig of the video signal applied to the pixel 101 in a following display period. If the correction period is a fixed period, the value of the voltage Vr for correction is varied depending on the value of the initial potential Vres for correction.

Figure 4:
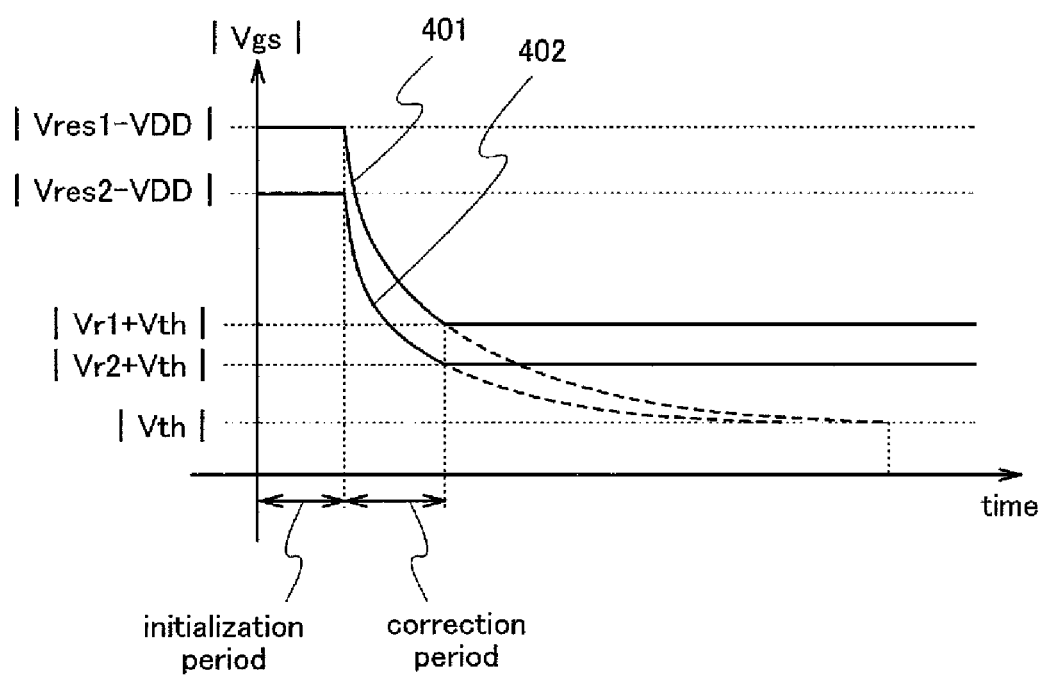
FIG. 4 is a diagram illustrating a time change of a gate voltage Vgs.

FIG. 4 shows a time change of the gate voltage Vgs when an initial potential Vres1 for correction and an initial potential Vres2 for correction having different values are applied to a pixel during the initialization period and then the gate and the drain of the driving transistor 105 come to be in a floating state. Note that |Vres1−VDD|>|Vres2−VDD|.

As shown in FIG. 4, when the initial potential Vres1 for correction is employed during the initialization period, the gate voltage of the driving transistor 105 is |Vgs|=|Vres1−VDD|. After the initialization period is over, when the gate and the drain of the driving transistor 105 come to be in a floating state, |Vgs| gradually decreases to be closer to |Vth|, as represented by a solid line 401. In the present invention, since the correction period is over before |Vgs| converges on |Vth| as represented by a dashed line, the transistor 107 is turned off at the time when |Vgs|=|Vr1+Vth|. Therefore, the absolute value of the gate voltage Vgs held in the capacitor 110 is |Vr|+Vth|.

On the other hand, as shown in FIG. 4, when the initial potential Vres2 for correction is employed during the initialization period, the gate voltage of the driving transistor 105 is |Vgs|=|Vres2−VDD|. After the initialization period is over, when the gate and the drain of the driving transistor 105 come to be in a floating state, |Vgs| gradually decreases to be closer to |Vth|, as represented by a solid line 402. In the present invention, since the correction period is over before |Vgs| converges on |Vth| as represented by a dashed line, the transistor 107 is turned off at the time when |Vgs|=|Vr2+Vth|. Therefore, the absolute value of the gate voltage Vgs held in the capacitor 110 is |Vr2+Vth|.

Since |Vres1−VDD|>|Vres2−VDD|, when the correction period is a fixed, |Vr1|>|Vr2|. Therefore, comparing the solid lines 401 and 402 shown in FIG. 4, it is obvious that in the case of the initial potential Vres1 for correction, |Vgs| at the time when the correction period is over is higher than |Vgs| at the time when the correction period is over in the case of the initial potential Vres2 for correction.

Next, the operation of displaying grayscale by the light-emitting element 104 by using the potential Vsig of the video signal will be described. In the pixel 101, during a period (a display period) of displaying grayscale, the switching transistor 106 is turned on, the transistor 107 is turned off, the transistor 108 is turned off, and the transistor 109 is turned on. The power supply potential VDD is applied to the source of the driving transistor 105. The potential Vsig of the video signal is applied to the one of electrodes of the capacitor 110 through the switching transistor 106.

Figure 2C:
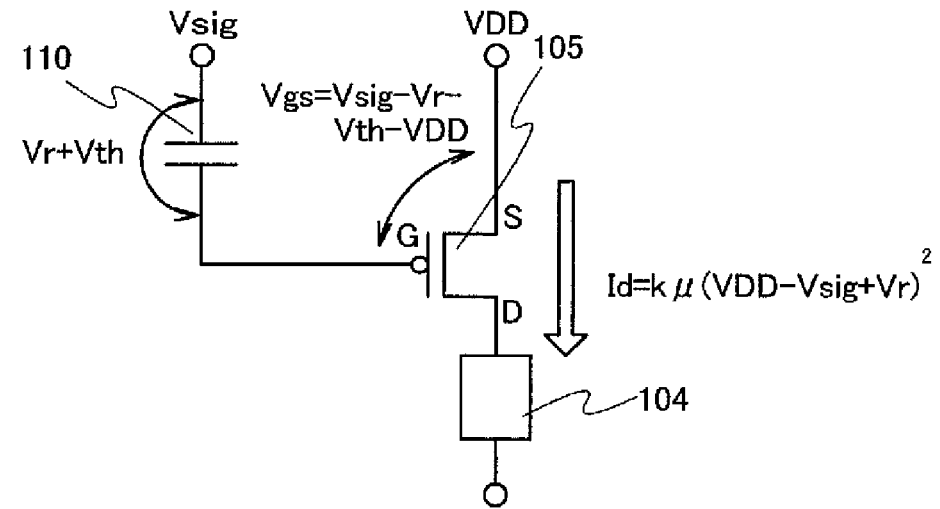

FIG. 2C shows a relation of connection of the driving transistor 105, the capacitor 110, and the light-emitting element 104 in the pixel 101 shown in FIG. 1B during the display period. As shown in FIG. 2C, during the display period, the potential Vsig of the video signal is applied to the one of electrodes of the capacitor 110, and the other electrode of the capacitor 110 is connected to the gate of the driving transistor 105. Since the charge stored in the capacitor 110 during the correction period is held, a potential obtained by subtracting Vr+Vth from the potential Vsig is applied to the gate of the driving transistor 105. Therefore, the gate voltage Vgs of the driving transistor 105 corresponds to Vsig−Vr−Vth−VDD. In addition, the drain current Id of the driving transistor 105 is represented by Formula 4 below.

$$Id=k\mu(VDD-Vsig+Vr)^2 \quad \text{(Formula 4)}$$

According to Formula 4, it is apparent that in the display device of the present invention, a fluctuation in the current value due to a variation in the threshold voltage Vth is canceled even if the threshold voltage Vth varies.

Moreover, the voltage Vr for correction has a negative value when the driving transistor is a p-channel transistor, and the smaller the mobility μ becomes, the larger the absolute value of the voltage Vr for correction becomes, whereas the larger the mobility μ becomes, the smaller the absolute value of the voltage Vr for correction becomes. Therefore, Vr functions as a correction term for correcting a variation in the current Id due to the mobility μ during a light-emitting period; a decrease in the current Id is suppressed even if the mobility μ decreases, whereas an increase in the current Id can be suppressed even if the mobility μ increases.

Note that the value of the initial potential for correction may be changed in stages or consecutively in accordance with the value of the potential of the video signal. In the former case, one of a plurality of initial potentials for correction may be selected by a reset line driver circuit and then applied to a pixel. In the latter case, an initial potential for correction which has an analog value can be applied to the pixel from the reset line driver circuit.

When the current Id which flows through the driving transistor during the correction period is denoted by Iref, the voltage Vr for correction is represented by $\{2/\text{ref}/(k\mu)\}^{1/2}$. That is, although Vr functions as the correction term as described above, Vr does not completely correct the variation.

However, comparing the amounts of the drain current Id of the driving transistor during the display period in the case where |Vgs| held in the capacitor 110 is |Vr|+Vth| and in the case where |Vgs| held in the capacitor 110 is |Vr2+Vth| at the time when the correction period is over, $|\text{Id}1|=|k\mu(\text{VDD}-\text{Vsig}+\text{Vr}1)^2|>|\text{Id}2|=|k\mu(\text{VDD}-\text{Vsig}+\text{Vr}2)^2|$ according to Formula 4. That is, as described in the present invention, when a high level of grayscale is displayed, the drain current Id of the driving transistor during the display period can be increased by making a difference between the initial potential Vres for correction and a reference potential big. On the contrary, when a low level of grayscale is displayed, the drain current Id of the driving transistor during the display period can be decreased by making the difference between the initial potential Vres for correction and the reference potential small.

In the present invention, when a high level of grayscale is displayed, since the difference between the potential Vsig and the reference potential is big and a coefficient of the mobility μ in Formula 4 becomes large, the fluctuation of the current value can be effectively corrected by the correction term Vr1. On the other hand, when a low level of grayscale is displayed, since the absolute value of the correction term Vr2 can be made smaller than that of the correction term Vr1, the current Id can be made closer to 0 as the difference between the potential Vsig and the reference potential becomes small. Therefore, not only in the case of displaying a high level of grayscale but also in the case of displaying a low level of grayscale, the fluctuation in the current value of the driving transistor due to the variation in the mobility can be suppressed and a variation in luminance due to the fluctuation can be suppressed.

Note that in order to correct the variation in the current value of the driving transistor due to the variation in the mobility μ more precisely, the value of the initial potential Vres for correction is determined in accordance with the value of the potential Vsig of the video signal so as to make A on the left side be the closest to 0 in Formula 5. Note that in Formula 5, t1 is a length of the correction period, μ is ideal mobility in the case of no variation or averaged mobility of the driving transistors, and C is the capacitance value of the capacitor 110. In addition, k=(W/L)×μ×$C_{ox}$, L and W are the channel length and the channel width of the driving transistor, respectively, and $C_{ox}$ is gate capacitance per unit area of the driving transistor.

$$A = t_1 + \frac{k\mu}{2C}\left(t_1 + \frac{2C}{k\mu} \times \frac{1}{VDD - Vth - Vres}\right)^2 \times Vsig - \frac{2C}{k\mu} \times \frac{1}{VDD - Vth - Vres}$$ [Formula 5]

In the present invention, as for all the levels of grayscale to be displayed, not only a variation in a current value due to a threshold voltage but also a variation in a current value due to mobility is adequately prevented from influencing luminance.

(Embodiment Mode 2)

In this embodiment mode, a specific structure and operation of a pixel included in a display device of the present invention will be described.

Figure 5A:
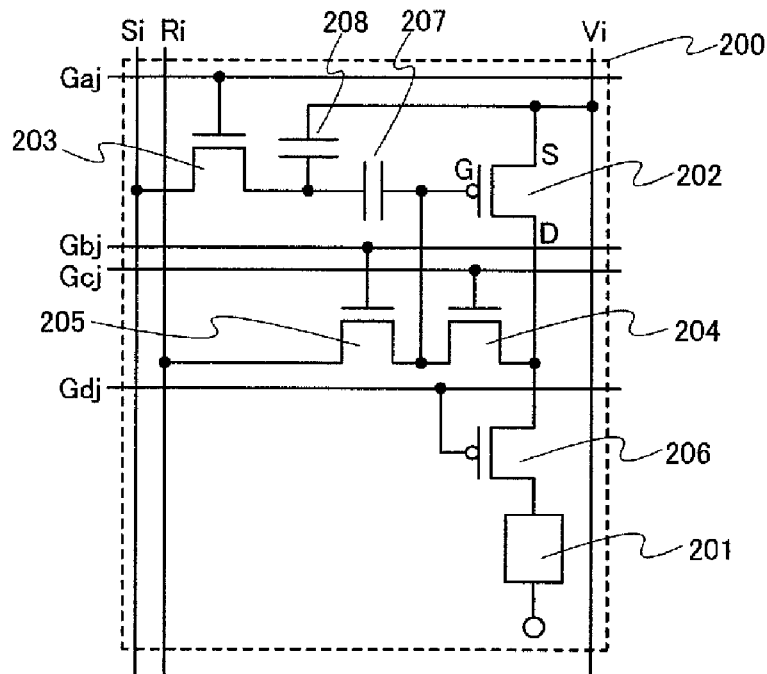
FIGS. 5A and 5B are a circuit diagram and a timing chart of a pixel included in a display device of the present invention, respectively.

FIG. 5A shows a circuit diagram of a pixel in this embodiment mode. A pixel 200 shown in FIG. 5A includes, in addition to a light-emitting element 201 and a driving transistor 202, a switching transistor 203 which samples a video signal having the potential Vsig, a transistor 204 which controls connection between a gate (G) and a drain (D) of the driving transistor 202, a transistor 205 which controls application of the initial potential Vres for correction to the gate (G) of the driving transistor 202, a transistor 206 which selects whether the drain of the driving transistor 202 is set to be in a floating state or not, a capacitor 207 for holding a voltage between the gate and a source of the driving transistor 202 during the correction period, and a capacitor 208 for holding a potential difference between the potential of the video signal and a reference potential during the display period.

Moreover, in this embodiment mode, the pixel 200 includes a signal line Si (i is any one of 1 to x) for supplying the potential Vsig of the video signal or the power supply potential VDD to the pixel 200, a reset line R1 (i is any one of 1 to x) for supplying the initial potential Vres for correction to the pixel 200, and a power supply line Vi (i is any one of 1 to x) for supplying the power supply potential VDD to the pixel 200.

One of a source and a drain of the switching transistor 203 is connected to the signal line Si and the other of the source and the drain of the switching transistor 203 is connected to one of electrodes of the capacitor 207 and one of electrodes of the capacitor 208. The other electrode of the capacitor 208 is connected to the power supply line Vi. The other electrode of the capacitor 207 is connected to the gate of the driving transistor 202. The source of the driving transistor 202 is connected to the power supply line Vi. Moreover, the transistor 206 is connected in series between a drain of the driving transistor 202 and the light-emitting element 201. One of a source and a drain of the transistor 205 is connected to the reset line R1, and the other of the source and the drain of the transistor 205 is connected to the gate of the driving transistor 202. Further, one of a source and a drain of the transistor 204 is connected to the gate of the driving transistor 202, and the other of the source and the drain of the transistor 204 is connected to the drain of the driving transistor 202.

Further, in this embodiment mode, the pixel 200 includes a scanning line Gaj (j is any one of 1 to y) connected to the gate of the switching transistor 203, a scanning line Gbj (j is any one of 1 to y) connected to the gate of the transistor 205, a scanning line Gcj (j is any one of 1 to y) connected to the gate of the transistor 204, and a scanning line Gdj (j is any one of 1 toy) connected to the gate of the transistor 206.

Note that in FIG. 5A, although a case where the driving transistor 202 is a p-channel transistor is shown as an example, the present invention is not limited thereto. The driving transistor 202 may be an n-channel transistor. However, since the example in which the driving transistor 202 is a p-channel transistor is described in this embodiment mode, the power supply potential VDD (VDD>Vres) is employed. In the case where the driving transistor 202 is an n-channel transistor, the power supply potential VSS (Vres>VSS) is employed.

Moreover, in FIG. 5A, although a case where the switching transistor 203, the transistor 204, and the transistor 205 are n-channel transistors and the transistor 206 is a p-channel transistor is illustrated, the present invention is not limited thereto. The switching transistor 203, and the transistors 204 to 206 may be either p-channel transistors or n-channel transistors.

Figure 5B:
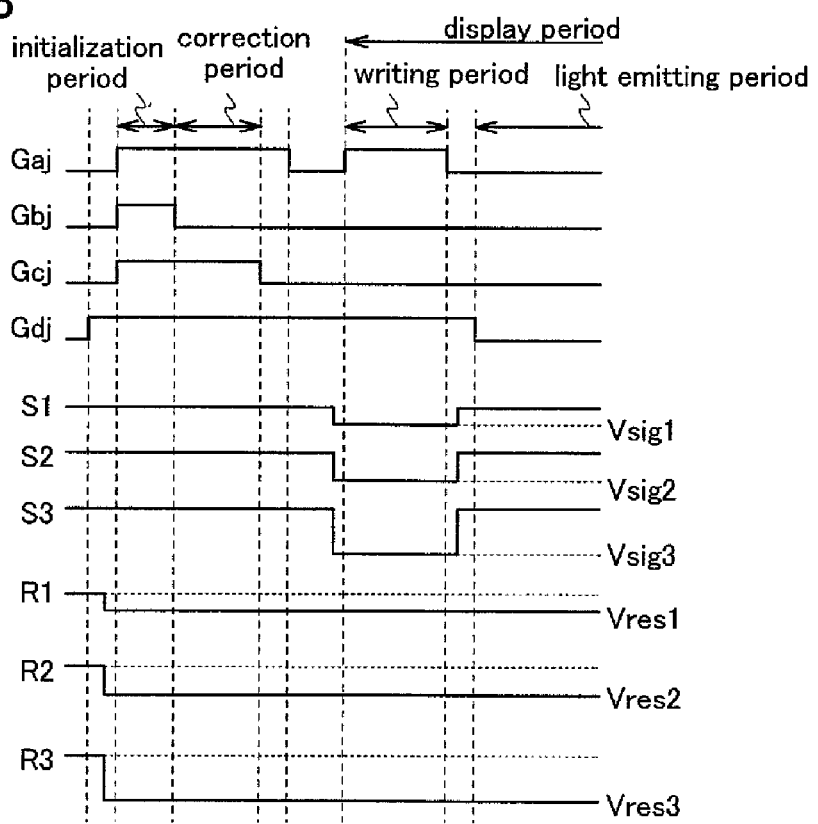

FIG. 5B is a timing chart of potentials applied to the scanning line Gaj, the scanning line Gbj, the scanning line Gcj, the scanning line Gdj, a signal line S1, a signal line S2, a signal line S3, a reset line R1, a reset line R2, and a reset line R3.

First, during the initialization period, since a high level potential is applied to the scanning line Gaj, the scanning line Gbj, the scanning line Gcj, and the scanning line Gdj, the switching transistor 203 is turned on, the transistor 204 is turned on, the transistor 205 is turned on, and the transistor 206 is turned off. The power supply potential VDD is applied to the signal line S1, the signal line S2, and the signal line S3. The initial potentials Vres1, Vres2, and Vres3 for correction are applied to the reset line R1, the reset line R2, and the reset line R3, respectively. Note that in this embodiment mode, an example is shown in which $|VDD-Vres1|<|VDD-Vres2|<|VDD-Vres3|$. A potential difference between the initial potential for correction and the power supply potential VDD is held in the capacitor 207.

Next, during the correction period, since a high-level potential is applied to the scanning line Gaj, the scanning line Gcj, and the scanning line Gdj and a low-level potential is applied to the scanning line Gbj, the switching transistor 203 is turned on, the transistor 204 is turned on, the transistor 205 is turned off, and the transistor 206 is turned off. The power supply potential VDD is kept being applied to the signal line S1, the signal line S2, and the signal line S3. The initial potentials Vres1, Vres2, and Vres3 for correction are kept being applied to the reset line R1, the reset line R2, and the reset line R3, respectively. During the correction period, charge stored in the capacitor 207 is discharged as time passes. Therefore, ultimately, the gate voltage Vgs which corresponds to the initial potentials Vres1, Vres2, and Vres3 for correction is held in the capacitor 207. Specifically, when the initial potential Vres1 for correction is applied to the pixel, the gate voltage Vgs to be held in the capacitor 207 just before the correction period is over is $|Vr1+Vth|$. When the initial potential Vres2 for correction is applied to the pixel, the gate voltage Vgs to be held in the capacitor 207 just before the correction period is over is $|Vr2+Vth|$. Moreover, when the initial potential Vres3 for correction is applied to the pixel, the gate voltage Vgs to be held in the capacitor 207 just before the correction period is over is $|Vr3+Vth|$. Note that since $|VDD-Vres1|<|VDD-Vres2|<|VDD-Vres3|$, $|Vr1+Vth|<|Vr2+Vth|<|Vr3+Vth|$.

Next, during a writing period included in the display period, since a high-level potential is applied to the scanning line Gaj and the scanning line Gdj and a low-level potential is applied to the scanning line Gbj and the scanning line Gcj, the switching transistor 203 is turned on, the transistor 204 is turned off, the transistor 205 is turned off, and the transistor 206 is turned off. The potential Vsig of the video signal is applied to the signal line S1, the signal line S2, and the signal line 53. In the present invention, the smaller a difference between the potential Vsig of the video signal applied to the pixel 200 during the display period and the reference potential (the power supply potential VDD in this embodiment mode) becomes, the smaller a difference between the initial potential Vres for correction and the reference potential (the power supply potential VDD in this embodiment mode) is made. Therefore, in the timing chart shown in FIG. 5B, when potentials of video signals applied to the signal line S1, the signal line S2, and the signal line S3 are denoted by Vsig1, Vsig2, and Vsig3, respectively, $|VDD-Vsig1|<|VDD-Vsig2|<|VDD-Vsig3|$. In this embodiment mode, since the initial potentials Vsig1, Vsig2, and Vsig3 for correction have negative values, Vsig1>Vsig2>Vsig3. A potential difference between each of the potentials Vsig1, Vsig2, and Vsig3 of the video signals and the reference potential (the power supply potential VDD in this embodiment mode) is stored in the capacitor 208 in each pixel 200.

Next, during the light-emitting period included in the display period, since a low-level potential is applied to the scanning line Gaj, the scanning line Gbj, the scanning line Gel, and the scanning line Gdj, the switching transistor 203 is turned off, the transistor 204 is turned off, the transistor 205 is turned off, and the transistor 206 is turned on. A voltage obtained by subtracting a voltage held in the capacitor 207 from a potential difference between a potential of a video signal held in the capacitor 208 and the reference potential (the power supply potential VDD in this embodiment mode) is applied to the driving transistor 202 as a gate voltage. A current corresponding to the gate voltage of the driving transistor 202 is supplied to the light-emitting element 201 in each pixel 200, so that the light-emitting element 201 performs display of grayscale.

In the present invention, the value of the initial potential Vres for correction is changed in accordance with the value of the potential Vsig of the video signal applied during the display period. Therefore, in the case of displaying a high level of grayscale, a fluctuation in a current value due to a variation in mobility can be effectively corrected. In the case of displaying a low level of grayscale, as a difference between the potential Vsig and the reference potential becomes small, the drain current of the driving transistor can be made closer to 0. Therefore, not only in the case of displaying a high level of grayscale but also in the case of displaying a low level of grayscale, the fluctuation in the current value of the driving transistor due to the variation in the mobility can be suppressed and the variation in luminance due to the fluctuation can be suppressed.

Therefore, in the present invention, as for all the levels of grayscale to be displayed, not only a variation in a current due to a threshold voltage but also a variation in a current due to mobility is adequately prevented from influencing luminance.

Moreover, in order to correct the variation in the current value of the driving transistor due to the variation in the mobility μ more precisely, the value of the initial potential Vres for correction is determined in accordance with the value of the potential Vsig of the video signal so as to make A on the left side the closest to 0 in Formula 5 described in Embodiment Mode 1.

This embodiment can be implemented in combination with the above-mentioned embodiment mode as appropriate.

(Embodiment Mode 3)

In this embodiment mode, a more specific structure and operation of a pixel included in a display device of the present invention will be described.

Figure 6A:
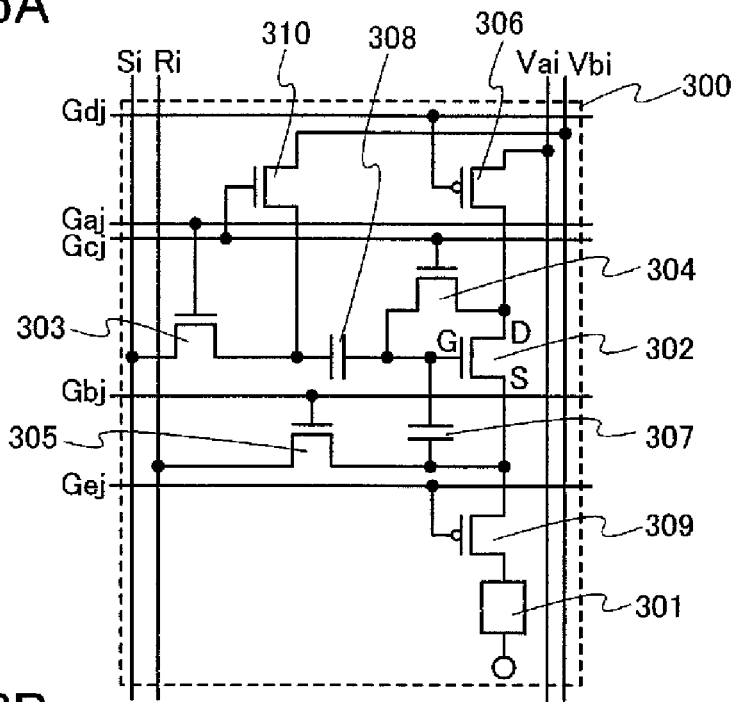
FIGS. 6A and 6B are a circuit diagram and timing chart of a pixel included in a display device of the present invention, respectively.

FIG. 6A shows a circuit diagram of a pixel in this embodiment mode. A pixel 300 shown in FIG. 6A includes, in addition to a light-emitting element 301 and a driving transistor 302, a switching transistor 303 which samples a video signal having the potential Vsig, a transistor 304 which controls connection between a gate (G) and a drain (D) of the driving transistor 302, a transistor 305 which controls application of the initial potential Vres for correction to the gate (G) of the driving transistor 302, a transistor 306 which selects whether the drain of the driving transistor 302 is set to be in a floating state or not, a capacitor 307 which holds a voltage between the gate and the source of the driving transistor 302 during the correction period, a capacitor 308 which holds a potential difference between the potential of the video signal and the reference potential during the display period, a transistor 309 which selects whether the source of the driving transistor 302 is set to be in a floating state or not, and a transistor 310 which controls supply of the power supply potential VDD to one of electrodes of the capacitor 308.

Moreover, in this embodiment mode, the pixel 300 includes a signal line Si (i is any one of 1 to x) for supplying the potential Vsig of the video signal or the power supply potential VDD to the pixel 300, a reset line Ri (i is any one of 1 to x) for supplying the initial potential Vres for correction to the pixel 300, a power supply line Vai (i is any one of 1 to x) for supplying a power supply potential VDD to the pixel 300, and a power supply line Vbi (i is any one of 1 to x) for supplying the power supply potential VDD'. Note that VDD's≦VDD.

One of a source and a drain of the switching transistor 303 is connected to the signal line Si, and the other of the source and the drain of the switching transistor 303 is connected to one of electrodes of the capacitor 308. The other electrode of the capacitor 308 is connected to the gate of the driving transistor 302 and one of electrodes of the capacitor 307. The other electrode of the capacitor 307 is connected to the source of the driving transistor 302. One of the source and the drain of the driving transistor 304 is connected to the gate of the driving transistor 302, and the other of the source and the drain of the driving transistor 304 is connected to the drain of the driving transistor 302. One of a source and a drain of the transistor 306 is connected to the power supply line Vai, and the other of the source and the drain of the transistor 306 is connected to the drain of the driving transistor 302. One of a source and a drain of the transistor 305 is connected to the reset line Ri, and the other of the source and the drain of the transistor 305 is connected to the source of the driving transistor 302. Further, one of a source and a drain of the transistor 309 is connected to the source of the driving transistor 302, and the other of the source and the drain of the transistor 309 is connected to the light-emitting element 301. One of a source and a drain of the transistor 310 is connected to one of electrodes of the capacitor 308, and the other of the source and the drain of the transistor 310 is connected to the power supply line Vbi.

Further, in this embodiment mode, the pixel 300 includes a scanning line Gaj (j is any one of 1 to y) connected to the gate of the switching transistor 303, a scanning line Gbj (j is any one of 1 to y) connected to the gate of the transistor 305, a scanning line Gcj (j is any one of 1 to y) connected to the gate of the transistor 304, a scanning line Gdj (j is any one of 1 to y) connected to the gate of the transistor 306, and a scanning line Gel (j is any one of 1 to y) connected to the gate of the transistor 309.

Note that in FIG. 6A, although a case where the driving transistor 302 is an n-channel transistor is shown as an example, the present invention is not limited thereto. The driving transistor 302 may be a p-channel transistor. However, since the example in which the driving transistor 302 is an n-channel transistor is shown in this embodiment mode, the power supply potential VDD is applied to the power supply line Vai and the power supply potential VDD' is applied to the power supply line Vbi. Note that VDD≧VDD'>Vres. In the case where the driving transistor 302 is a p-channel transistor, the power supply potential VSS is applied to the power supply line Vai and a power supply potential VSS' is applied to the power supply line Vbi. Note that Vres>VSS'≧VSS.

Moreover, in FIG. 6A, although a case where the switching transistor 303, the transistor 304, the transistor 305, and the transistor 310 are n-channel transistors and the transistor 306 and the transistor 309 are p-channel transistors is illustrated, the present invention is not limited thereto. The switching transistor 303, and the transistors 304 to 306, the transistor 309, and the transistor 310 may be either n-channel transistors or p-channel transistors.

Figure 6B:
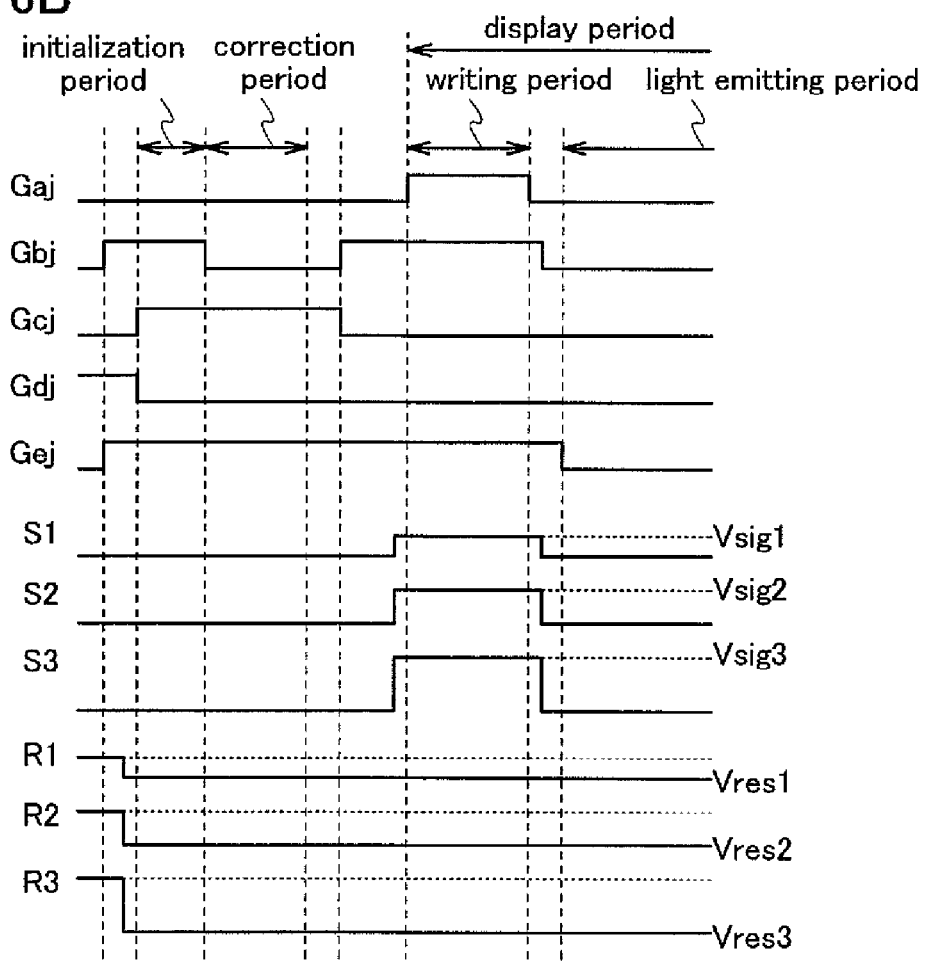

FIG. 6B is a timing chart of potentials applied to the scanning line Gaj, the scanning line Gbj, the scanning line Gcj, the scanning line Gdj, the scanning line Gej, the signal line S1, the signal line S2, the signal line S3, the reset line R1, the reset line R2, and the reset line R3.

First, during the initialization period, since a low-level potential is applied to the scanning line Gaj and the scanning line Gdj and a high-level potential is applied to the scanning line Gbj, the scanning line Gcj, and the sccaning line Gej, the switching transistor 303 is turned off, the transistor 304 is turned on, the transistor 305 is turned on, the transistor 306 is turned on, the transistor 309 is turned off, and the transistor 310 is turned on. The initial potentials Vres1, Vres2, and Vres3 for correction are applied to the reset line R1, the reset line R2, and the reset line R3, respectively. Note that in this embodiment mode, an example is shown in which |VDD−Vres1|<|VDD−Vres2|<|VDD−Vres3|. A potential difference between the initial potential for correction and the power supply potential VDD is held in the capacitor 307.

Next, during the correction period, since a low-level potential is applied to the scanning line Gaj, the scanning line Gbj, and the scanning line Gdj and a high-level potential is applied to the scanning line Gcj and the scanning line Gej, the switching transistor 303 is turned off, the transistor 304 is turned on, the transistor 305 is turned off, the transistor 306 is turned on, the transistor 309 is turned off, and the transistor 310 is turned on. The initial potentials Vres1, Vres2, and Vres3 for correction are kept being applied to the reset line R1, the reset line R2, and the reset line R3, respectively. During the correction period, charge stored in the capacitor 307 is discharged as time passes. Therefore, ultimately, the gate voltage Vgs which corresponds to the initial potentials Vres1, Vres2, and Vres3 for correction is held in the capacitor 307. Specifically, when the initial potential Vres1 for correction is applied to the pixel, the gate voltage Vgs to be held in the capacitor 307 just before the correction period is over is |Vr1+Vth|. When the initial potential Vres2 for correction is applied to the pixel, the gate voltage Vgs to be held in the capacitor 307 just before the correction period is over is |Vr2+Vth|. Moreover, when the initial potential Vres3 for correction is applied to the pixel, the gate voltage Vgs to be held in the capacitor 307 just before the correction period is over is |Vr3+Vth|. Note that since |VDD−Vres|I<|VDD−Vres2|<|VDD−Vres3|, |Vr1+Vth|<|Vr2+Vth|<|Vr3+Vth|. In addition, a potential difference between the power supply potential VDD and the power supply potential VDD' is held in the capacitor 308.

Next, during the writing period included in the display period, since a low-level potential is applied to the scanning line Gcj and the scanning line Gdj, and a high-level potential is applied to the scanning line Gaj, the scanning line Gbj, and the scanning line Gej, the switching transistor 303 is turned on, the transistor 304 is turned off, the transistor 305 is turned on, the transistor 306 is turned on, the transistor 309 is turned off, and the transistor 310 is turned off. The potential Vsig of the video signal is applied to the signal line S1, the signal line S2, and the signal line S3. In the present invention, the smaller a difference between the potential Vsig of the video signal applied to the pixel 300 during the display period and a reference potential (the power supply potential VSS of a common electrode included in the light-emitting element 301 in this embodiment mode) becomes, the smaller the difference between the initial potential Vres for correction and a reference potential (the power supply potential VDD in this embodiment mode) is made. Therefore, in the timing chart shown in FIG. 6B, when potentials of video signals applied to the signal line S1, the signal line S2, and the signal line S3 are denoted by Vsig1, Vsig2, and Vsig3, respectively, |Vsig1−VSS|<|Vsig2−VSS|<|Vsig3−VSS|. A potential difference between a potential obtained by adding the potentials Vsig1, Vsig2, or Vsig3 of the video signals to a potential difference between the power supply potential VDD and the power supply potential VDD′, and the reference potential (the power supply potential VDD in this embodiment mode) is held in the capacitor 308 in each pixel 300.

Next, during the light-emitting period included in the display period, since a low-level potential is applied to the scanning line Gaj, the scanning line Gbj, the scanning line Gcj the scanning line Gdj, and the scanning line Gej, the switching transistor 303 is turned off, the transistor 304 is turned off, the transistor 305 is turned off, the transistor 306 is turned on, the transistor 309 is turned on, and the transistor 310 is turned off. A voltage obtained by subtracting a voltage held in the capacitor 307 from a voltage held in the capacitor 308 is applied to the driving transistor 302 as a gate voltage. A current corresponding to the gate voltage of the driving transistor 302 is supplied to the light-emitting element 301 in each pixel 300, so that the light-emitting element 301 performs display of grayscale.

In the present invention, the value of the initial potential Vres for correction is changed in accordance with the value of the potential Vsig of the video signal applied during the display period. Therefore, in the case of displaying a high level of grayscale, a fluctuation in a current value due to a variation in mobility can be effectively corrected. In the case of displaying a low level of grayscale, as a difference between the potential Vsig and the reference potential becomes small, the drain current of the driving transistor can be made closer to 0. Therefore, not only in the case of displaying a high level of grayscale but also in the case of displaying a low level of grayscale, the fluctuation in the current value of the driving transistor due to the variation in the mobility can be suppressed and the variation in luminance due to the fluctuation can be suppressed.

In the case where the power supply potential VDD is equal to the power supply potential VDD′, one of the source and the drain of the transistor 306 may be connected to the power supply line Vai and the other of the source and the drain of the transistor 306 may be connected to the drain of the driving transistor 302, without providing the power supply line Vbi. In this case, the number of wirings provided for a pixel portion can be reduced, a yield can be improved, and the aperture ratio of the pixel can be improved. In the case where the power supply potential VDD is higher than the power supply potential VDD′, the power supply line Vbi is necessary. In this case, a potential of a signal line can be prevented from becoming unnecessarily high due to the voltage held in the capacitor 308 in the correction period when the switching transistor 303 is turned on.

Moreover, in order to correct the variation in the current value of the driving transistor due to the variation in the mobility μ more precisely, the initial potential Vres for correction is determined in accordance with the value of the potential Vsig of the video signal so as to make A on the left side the closest to 0 in Formula 5 described in Embodiment Mode 1.

Therefore, in the present invention, as for all the levels of grayscale to be displayed, not only a variation in a current value due to a threshold voltage but also a variation in a current due to mobility is adequately prevented from influencing luminance.

This embodiment can be implemented in combination with any of the embodiment modes as appropriate.

(Embodiment Mode 4)

Figure 7:
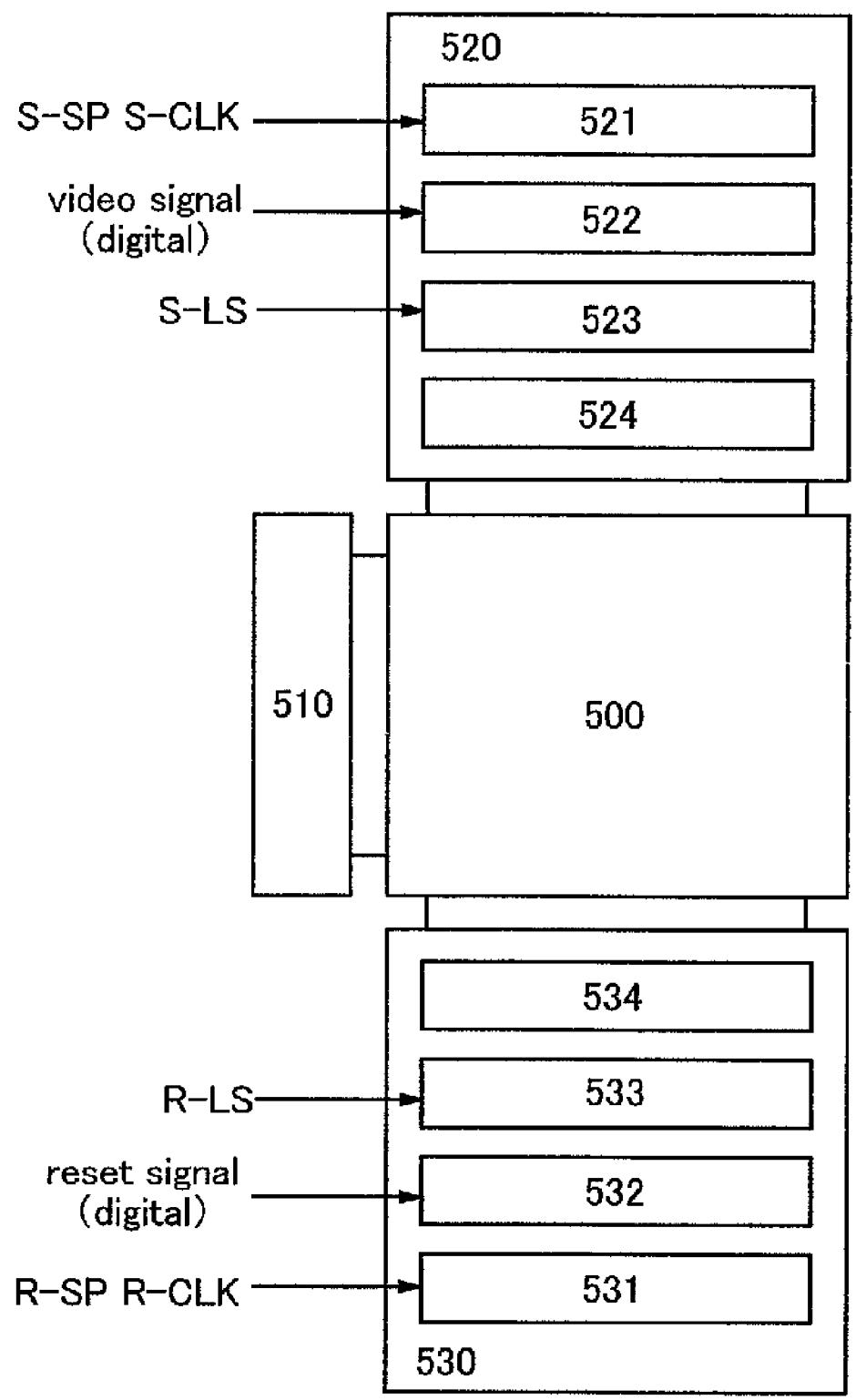
FIG. 7 is a block diagram illustrating a structure of a display device of the present invention.

In this embodiment mode, an overall structure of the display device of the present invention will be described. In FIG. 7, a block diagram of a display device of this embodiment mode is shown by way of an example.

The display device shown in FIG. 7 includes a pixel portion 500 having a plurality of pixels each provided with a light-emitting element, a scanning line driver circuit 510 for selecting pixels per line, a signal line driver circuit 520 for controlling the input of a video signal to pixels of a selected line, and a reset line driver circuit 530 for controlling input of an initial potential for correction to pixels of a selected line.

In FIG. 7, the signal line driver circuit 520 includes a shift register 521, a first latch 522, a second latch 523, and a DA (digital to analog) converter 524. A clock signal S-CLK and a start pulse signal S-SP are input to the shift register 521. The shift register 521 generates a timing signal of which pulse sequentially shifts in accordance with the clock signal S-CLK and the start pulse signal S-SP and outputs the timing signal to the first latch 522. The order of the appearance of the pulses of the timing signal may be switched in accordance with a scanning direction switching signal.

When a timing signal is input to the first latch 522, a video signal is sequentially written into and held in the first latch 522 in accordance with a pulse of the timing signal. Video signals may be sequentially input to a plurality of memory circuits included in the first latch 522; however, the plurality of memory circuits included in the first latch 522 may be divided into some groups, and video signals may be input to respective groups in parallel, that is, a so-called division driving may be performed. Note that the number of groups at this time is called a division number. For example, in the case where a latch is divided into four groups, division driving can be performed with four divisions.

The time until video signal writing into all of the memory circuits of the first latch 522 is completed is called a line period. In practice, the line period may include a period when a horizontal retrace interval is added to the line period.

When one line period is completed, the video signals held in the first latch 522 are written into the second latch 523 all at once and held in accordance with a pulse of a latch signal S-LS which is to be input to the second latch 523. The next video signal is sequentially written into the first latch 522 which has finished sending the video signals to the second latch 523, in accordance with a timing signal from the shift register 521 again. During this second round of the one line period, the video signals written into and held in the second latch 523 are input to the DA converter 524.

The DA converter 524 converts an input digital video signal into an analog video signal and inputs the analog video signal to each pixel included in the pixel portion 500 through the signal line.

Note that the signal line driver circuit 520 may use another circuit which can output a signal of which pulse sequentially shifts instead of the shift register 521.

Note that, although the pixel portion 500 is directly connected to the lower stage of the DA converter 524 in FIG. 7, the present invention is not limited to this structure. A circuit which performs signal processing on the video signal output from the DA converter 524 can be provided at a stage prior to the pixel portion 500. As examples of the circuit which performs signal processing, a buffer which can shape a waveform and the like can be given.

Like the signal line driver circuit 520, the reset line driver circuit 530 includes a shift register 531, a first latch 532, a second latch 533, and a DA converter 534. A clock signal R-CLK and a start pulse signal R-SP are input to the shift register 531. The shift register 531 generates a timing signal whose pulse sequentially shifts in accordance with the clock signal R-CLK and the start pulse signal R-SP, and outputs the timing signal to the first latch 532. The order of the appearance of the pulses of the timing signal may be switched in accordance with a scanning direction switching signal. Note that the order of the appearance of the pulses of the timing signal in the reset line driver circuit 530 is determined in accordance with the order of the appearance of the pulses of the timing signal in the signal line driver circuit 520.

When a timing signal is input to the first latch 532, a reset signal is sequentially written into and held in the first latch 532 in accordance with a pulse of the timing signal. Reset signals may be sequentially input to a plurality of memory circuits included in the first latch 532; however, the plurality of memory circuits included in the first latch 532 may be divided into some groups, and reset signals may be input to respective groups in parallel, that is, a so-called division driving may be performed. Note that the number of groups at this time is called a division number. For example, in the case where a latch is divided into four groups, division driving can be performed with four divisions.

The time until reset signal writing into all of the memory circuits of the first latch 532 is completed is called a line period. In practice, the line period may include a period when a horizontal retrace interval is added to the line period.

When one line period is completed, the reset signals held in the first latch 532 are written into the second latch 533 all at once and held in accordance with a pulse of a latch signal R-LS which is to be input to the second latch 533. The next reset signal is sequentially written into the first latch 532 which has finished sending the reset signals to the second latch 533, in accordance with a timing signal from the shift register 531 again. During this second round of the one line period, the reset signals written into and held in the second latch 533 are input to the DA converter 534.

The DA converter 534 converts an input digital reset signal to an analog reset signal. A potential of the analog reset signal is input as an initial potential for correction from the DA converter 534 through the reset line to each pixel in the pixel portion 500.

Note that the reset line driver circuit 530 may use another circuit which can output a signal whose pulse sequentially shifts instead of the shift register 531.

Note that the pixel portion 500 is directly connected to the lower stage of the DA converter 534 in FIG. 7; however, the present invention is not limited to this structure. A circuit which performs signal processing on the reset signal output from the DA converter 534 may be provided at the stage prior to the pixel portion 500. As examples of the circuit which performs signal processing, a buffer which can shape a waveform and the like are given.

Next, operation of the scanning line driver circuit 510 will be described. In a display device of the present invention, a plurality of scanning lines is provided for each pixel in the pixel portion 500. The scanning line driver circuit 510 generates a selection signal and inputs the selection signal to each of the plurality of scanning lines to select pixels per line. When a pixel is selected by the selection signal, the switching transistor, a gate of which is connected to one of the plurality of scanning lines, is turned on and a video signal is input to the pixel. Moreover, when the pixel is selected by the selection signal, a transistor which controls supply of the initial potential for correction and whose gate is connected to one of the plurality of scanning lines is turned on, and a reset signal is input to the pixel. Further, besides the above-mentioned transistors, switching of transistors which function as switching devices and are provided for the pixel is controlled by the selection signal.

Note that in this embodiment mode, although the example is described in which all the selection signals input to the plurality of scanning lines are generated in one scanning line driver circuit 510, the present invention is not limited thereto. The selection signals input to the plurality of scanning lines can be generated in a plurality of scanning line driver circuits 510.

Note that although the pixel portion 500, the scanning line driver circuit 510, the signal line driver circuit 520, and the reset line driver circuit 530 may be provided over the same substrate, any of these may be provided over a different substrate.

This embodiment can be implemented in combination with any of the embodiment modes as appropriate.

(Embodiment Mode 5)

Figure 8:
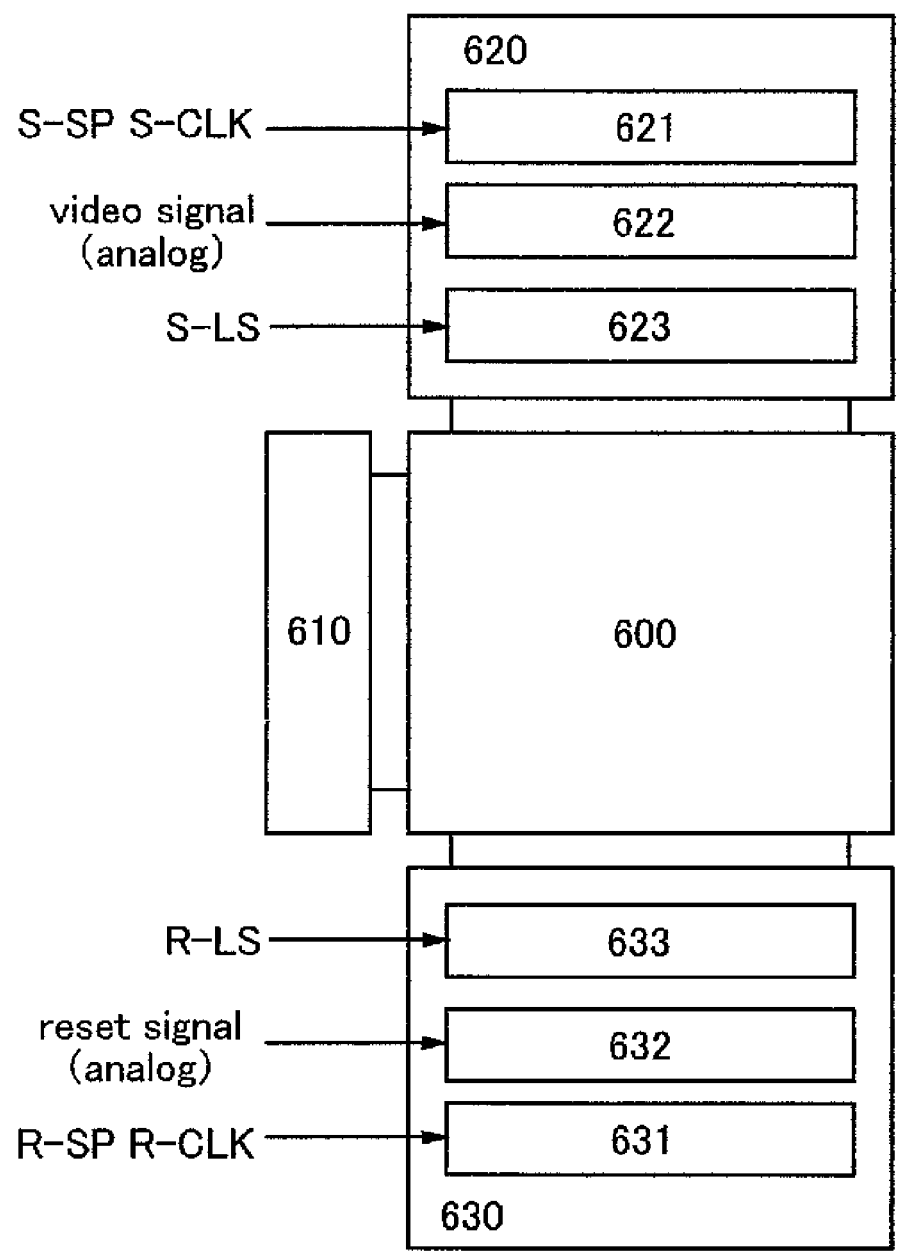
FIG. 8 is a block diagram illustrating a structure of a display device of the present invention.

In this embodiment mode, an overall structure of the display device of the present invention will be described. In FIG. 8, a block diagram of a display device of this embodiment mode is shown by way of example.

The display device of the present invention shown in FIG. 8 includes a pixel portion 600 having a plurality of pixels, a scanning line driver circuit 610 for selecting a plurality of pixels per line, a signal line driver circuit 620 for controlling the input of a video signal to pixels of a selected line, and a reset line driver circuit 630 for controlling input of a reset signal to pixels of a selected line.

The signal line driver circuit 620 includes at least a shift register 621, a sampling circuit 622, and a latch 623 which can store an analog signal. A clock signal S-CLK and a start pulse signal S-SP are input to the shift register 621. The shift register 621 generates a timing signal whose pulse sequentially shifts in accordance with the clock signal S-CLK and the start pulse signal S-SP and inputs the timing signal to the sampling circuit 622. The sampling circuit 622 samples video signals for one line period, which are input to the signal line driver circuit 620, in accordance with the input timing signal. When all the video signals for one line period are sampled, the sampled video signals are output and stored all at once to the latch 623 in accordance with the latch signal S-LS. The video signals stored in the latch 623 is input to the pixel portion 600 through the signal line.

Note that in this embodiment mode, an example is described in which all the video signals for one line period are sampled in the sampling circuit 622 and then, the sampled video signals are input all at once to the latch 623 in the lower stage; however, the present invention is not limited thereto. In the sampling circuit 622, every time when a video signal corresponding to each pixel is sampled, the sampled video signal may be input to the latch 623 in the lower stage without waiting for one line period to finish.

In addition, video signals may be sampled for one pixel at one time serially after completion of sampling of video signals for another pixel, or pixels in one line may be divided into several groups and video signals may be sampled with respect to each pixel corresponding in one group at the same time.

Note that in FIG. 8, although the pixel portion 600 is directly connected to the latch 623 in the lower stage, the present invention is not limited thereto. A circuit which processes the analog video signal output from the latch 623 can be provided in a previous stage of the pixel portion 600. Examples of a circuit which processes a signal include a buffer which can shape a waveform, and the like.

Then, when a video signal is input to the pixel portion 600 from the latch 623, the sampling circuit 622 can sample a video signal corresponding to the next line period again at the same time.

Like the signal line driver circuit 620, the reset line driver circuit 630 includes at least a shift register 631, a sampling circuit 632, and a latch 633 which can store an analog signal. A clock signal R-CLK and a start pulse signal R-SP are input to the shift register 631. The shift register 631 generates a timing signal whose pulse sequentially shifts, in accordance with the clock signal R-CLK and the start pulse signal R-SP, and inputs the timing signal to the sampling circuit 632. The sampling circuit 632 samples analog reset signals for one line period, which are input to the reset line driver circuit 630, in accordance with the input timing signal. When all the reset signals for one line period are sampled, the sampled reset signals are output all at once to the latch 633 in accordance with the latch signal R-LS and stored. Potentials of the reset signals stored in the latch 633 are input as the initial potential for correction to the pixel portion 600 through the reset line.

Note that in this embodiment mode, an example is described in which all the reset signals for one line period are sampled in the sampling circuit 632 and then, the sampled reset signals are input all at once to the latch 633 in the lower stage; however, the present invention is not limited thereto. In the sampling circuit 632, every time when a reset signal corresponding to each pixel is sampled, the sampled reset signal may be input to the latch 633 in the lower stage without waiting for one line period to finish.

In addition, video signals may be sampled for one pixel at one time serially after completion of sampling of reset signals for another pixel, or pixels in one line may be divided into several groups and reset signals may be sampled with respect to each pixel corresponding in one group at the same time.

Note that in FIG. 8, although the pixel portion 600 is directly connected to the latch 633 in the lower stage, the present invention is not limited thereto. A circuit which performs signal processing on the analog reset signal output from the latch 633 can be provided in a previous stage of the pixel portion 600. Examples of a circuit which performs signal processing include a buffer which can shape a waveform and the like.

Then, when a reset signal is input to the pixel portion 600 from the latch 633, the sampling circuit 632 can sample a reset signal corresponding to the next line period again at the same time.

Next, operation of the scanning line driver circuit 610 will be described. In a display device of the present invention, a plurality of scanning lines is provided for each pixel in the pixel portion 600. The scanning line driver circuit 610 generates a selection signal and inputs the selection signal to each of the plurality of scanning lines to select pixels per line. When a pixel is selected by the selection signal, a switching transistor whose gate is connected to one of the plurality of scanning lines is turned on and a video signal is input to the pixel. Moreover, when the pixel is selected by the selection signal, a transistor which controls supply of the initial potential for correction and whose gate is connected to one of the plurality of scanning lines is turned on, and a reset signal is input to the pixel. Further, besides the above-mentioned transistors, switching of transistors which function as switching device and are provided for the pixel is controlled by the selection signal.

Note that in this embodiment mode, although the example is described in which all the selection signals input to the plurality of scanning lines are generated in one scanning line driver circuit 610, the present invention is not limited thereto. The selection signals input to the plurality of scanning lines may be generated in a plurality of scanning line driver circuit 610.

Note that although the pixel portion 600, the scanning line driver circuit 610, the signal line driver circuit 620, and the reset line driver circuit 630 can be provided over the same substrate, any of these may be provided over a different substrate.

This embodiment can be implemented in combination with any of the embodiment modes as appropriate.

(Embodiment Mode 6)

In this embodiment mode, timing of appearance of the initialization period, the correction period, the display period in one frame period will be described with reference to FIG. 9.

Figure 9:
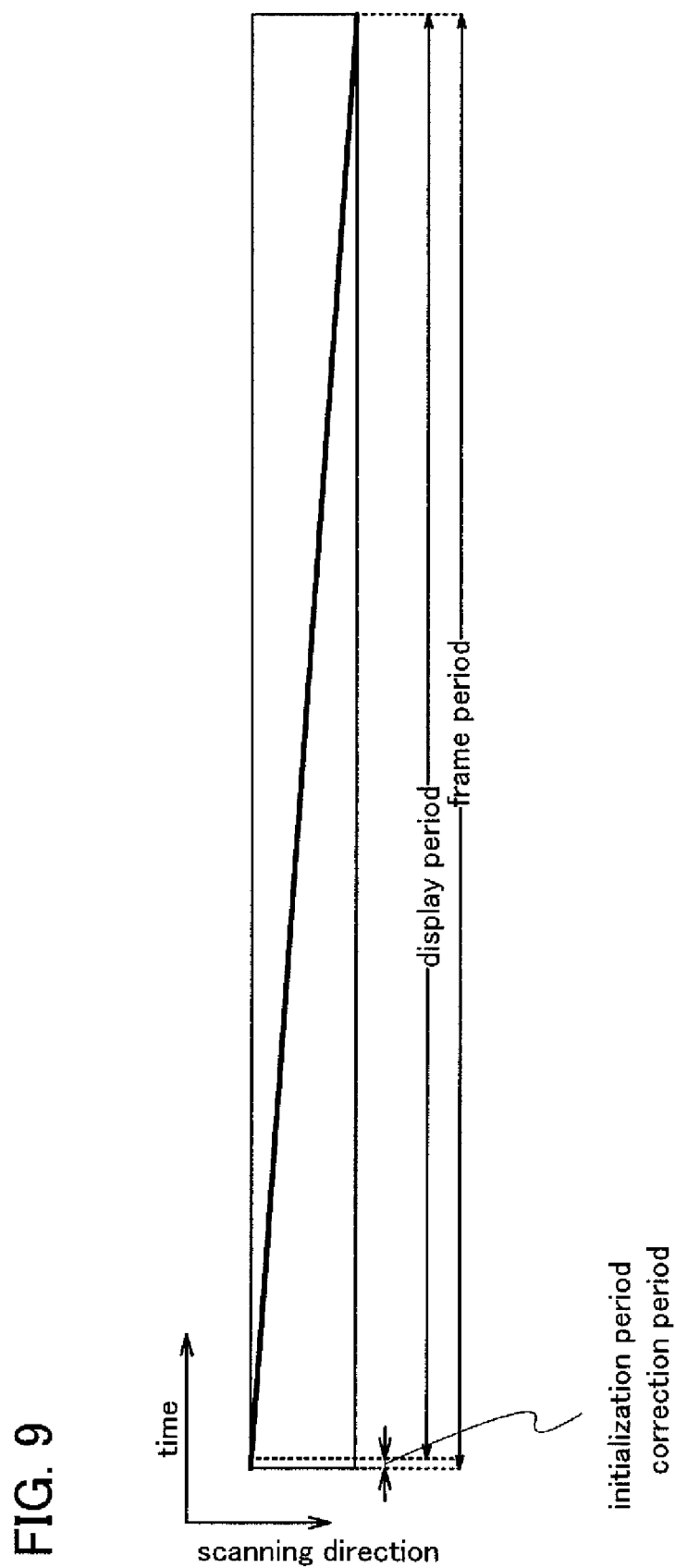
FIG. 9 is a diagram illustrating timings when an initialization period, a correction period, and a display period come in one frame period.

FIG. 9 is a diagram showing timing of appearance of the initialization period, the correction period, and the display period. A horizontal axis represents a time, and a vertical axis represents a scanning direction of a pixel which is selected line by line by the scanning line driver circuit.

In FIG. 9, first, during the initialization period, pixels in each line are selected in sequence by the scanning line driver circuit. An initial potential for correction is input from the reset line driver circuit to the pixels in the selected line. The correction period starts in order from pixels in a line in which input of the initial potential for correction during the initialization period is completed, and operation for obtaining a voltage for correction starts.

When the correction period is over, the display period starts next. The display period includes the writing period and the light-emitting period. During the writing period, when pixels in each line are selected in sequence by the scanning line driver circuit, an analog video signal is input to the pixels in the selected line from a signal line driver circuit. The light-emitting period starts in order from pixels in a line in which input of the video signal during the writing period is completed, and display is performed in accordance with a potential of the video signal. The frame period includes the initialization period, the correction period, and the display period. When the display period in the previous frame period is over, the initialization period in a following period starts.

This embodiment can be implemented in combination with any of the embodiment modes as appropriate.

(Embodiment Mode 7)

In this embodiment mode, the structure of the signal line driver circuit described in Embodiment Mode 4 will be described more specifically.

Figure 10:
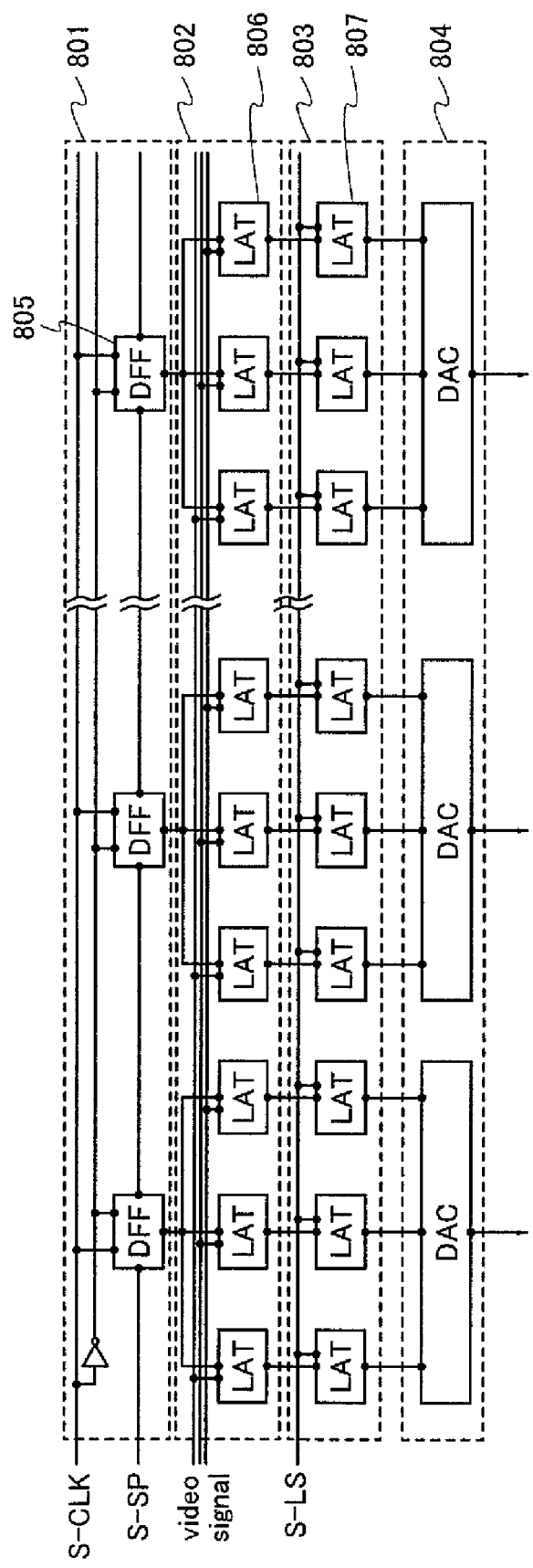
FIG. 10 is a block diagram illustrating a structure of a signal line driver circuit included in a display device of the present invention.

FIG. 10 shows an example of a circuit diagram of the signal line driver circuit. The signal line driver circuit shown in FIG. 10 includes a shift register 801, a first latch 802, a second latch 803, and a D/A converter 804.

The shift register 801 includes a plurality of delay flip flops (DFFs) 805. The shift register 801 generates a timing signal, a pulse of which is sequentially shifted, in accordance with a start pulse signal S-SP and a clock signal S-CLK which are input, and the timing signal is input to the first latch 802 in the lower stage.

The first latch 802 includes a plurality of memory circuits (LATs) 806. The number of the memory circuits 806 is preferably the same as or more than the number obtained by multiplying the number of pixels of one line in a pixel portion by the number of bits of a video signal. Note that although an example in which the number of bits of the video signal is three is described in FIG. 10, the number of bits of the video signal is not limited thereto. The first latch 802 sequentially samples video signals in accordance with the pulse of the input timing signal, and data of the sampled video signals is written to the memory circuits 806.

The second latch 803 includes a plurality of memory circuits (LATs) 807. The number of the memory circuits 807 is preferably the same as or more than the number obtained by multiplying the number of pixels of one line in the pixel portion by the number of bits of the video signal. The data which is written to the memory circuits 806 in the first latch 802 is written to and is held in the memory circuits 807 included in the second latch 803.

The data held in the memory circuits 807 is input as a video signal to the DA converter 804 in the lower stage. The DA converter 804 converts an input digital video signal into an analog video signal and inputs the analog signal to the pixel portion in the lower stage.

In this embodiment mode, although the structure of the signal line driver circuit is described, the reset line driver circuit may have a structure similar to that of the signal line driver circuit shown in FIG. 10. However, in the case of the reset line driver circuit, a reset signal is employed instead of a video signal, the start pulse signal R-SP and the clock signal R-CLK are employed instead of the start pulse signal S-SP and the clock signal S-CLK, and the latch signal R-LS is employed instead of the latch signal S-LS.

This embodiment can be implemented in combination with any of the embodiment modes as appropriate.

[Embodiment 1]

In this embodiment, a manufacturing method of a display device of the present invention will be described. Although this embodiment illustrates a thin film transistor (TFT) as an exemplary semiconductor element, a semiconductor element used in the display device of the invention is not limited to this. For example, not only a TFT but also a memory element, a diode, a resistor, a coil, a capacitor, an inductor, or the like can be used.

Figure 11A:
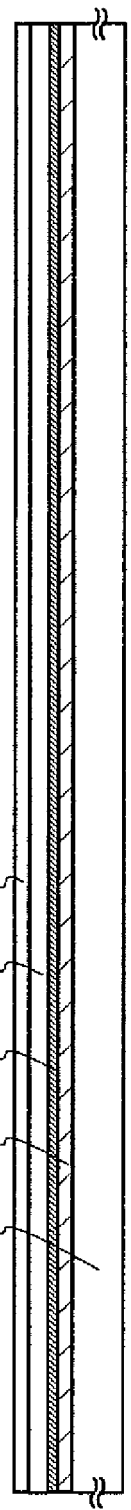
FIGS. 11A to 11C are diagrams illustrating a manufacturing method of a display device of the present invention.

First, as shown in FIG. 11A, an insulating film 701, a separation layer 702, an insulating film 703, and a semiconductor film 704 are formed sequentially over a substrate 700 having heat-resisting properties. The insulating film 701, the separation layer 702, the insulating film 703, and the semiconductor film 704 can be formed in succession.

As the substrate 700, a glass substrate such as barium borosilicate glass or aluminoborosilicate glass, a quartz substrate, a ceramic substrate, or the like can be used. Further, a metal substrate including a stainless-steel substrate or a semiconductor substrate such as a silicon substrate may be used as well. A substrate made of a synthetic resin having flexibility such as plastics which generally has the heat-resistance temperature which is lower than those of the above-described substrates can be used as long as it can withstand the process temperature in a manufacturing process.

As a plastic substrate, polyester typified by polyethylene terephthalate (PET); polyether sulfone (PES); polyethylene naphthalate (PEN); polycarbonate (PC); a polyamide synthetic fiber; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin; and the like can be given.

Although the separation layer 702 is provided over the entire surface of the substrate 700 in this embodiment, the invention is not limited thereto. For example, the separation layer 702 may be formed partly over the substrate 700 by a photolithography method or the like.

The insulating films 701 and 703 are formed by using an insulating material such as silicon oxide, silicon nitride, silicon oxynitride ($SiO_xN_y$ where x>y>0), or silicon nitride oxide ($SiN_xO_y$ where x>y>0) by a CVD method, a sputtering method, or the like.

The insulating film 701 and the insulating film 703 are provided to prevent an alkali metal such as Na or an alkaline earth metal contained in the substrate 700 from diffusing into the semiconductor film 704 and having an adverse effect on a characteristic of a semiconductor element such as a TFT. Further, the insulating film 703 also has roles of preventing an impurity element contained in the separation layer 702 from diffusing into the semiconductor film 704 and of protecting a semiconductor element in a subsequent step in which the semiconductor element is separated from the substrate 700. Furthermore, with the insulating film 703, the separation layer 702 can be easily separated or a semiconductor element or a wiring can be prevented from being cracking and damaged in a subsequent separation step.

Each of the insulating films 701 and 703 can be either a single insulating film or stacked layers of a plurality of insulating films. In this embodiment, a silicon oxynitride film with a thickness of 100 nm, a silicon nitride oxide film with a thickness of 50 nm, and a silicon oxynitride film with a thickness of 100 nm are stacked in this order to form the insulating film 703; however, the materials and film thicknesses of each layer and the number of layers stacked are not limited thereto. For example, instead of the silicon oxynitride film, which is a lower layer, a siloxane-based resin with a thickness of 0.5 to 3 μm may be formed by a spin coating method, a slit coater method, a droplet discharge method, a printing method, or the like. Instead of the silicon nitride oxide film, which is a middle layer, a silicon nitride film may be used. Instead of the silicon oxynitride film which is an upper layer, a silicon oxide film may be used. The thickness of each film is preferably in the range of 0.05 to 3 μm and can be selected from that range at will.

Alternatively, the lower layer which is the closest to the separation layer 702, the middle layer, and the upper layer of the insulating film 703 may be formed of a silicon oxynitride film or a silicon oxide film, a siloxane-based resin, and a silicon oxide film, respectively.

Note that a siloxane-based resin is a resin formed from a siloxane-based material as a starting material and having the bond of Si—O—Si. A siloxane-based resin may contain as a substituent at least one of fluorine, an alkyl group, and aromatic hydrocarbon, in addition to hydrogen.

The silicon oxide film can be formed using a mixed gas of silane and oxygen, TEOS (tetraethoxysilane) and oxygen, or the like by a method such as thermal CVD, plasma CVD, atmospheric pressure CVD, or bias ECRCVD. In addition, a silicon nitride film can be typically formed using a mixed gas of silane and ammonia by a plasma CVD method. Moreover, a silicon oxynitride film and a silicon nitride oxide film can typically be formed using a mixed gas of silane and nitrogen oxide by a plasma CVD method.

As the separation layer 702, a metal film, a metal oxide film, or a film in which a metal film and a metal oxide film are stacked can be used. The metal film and the metal oxide film can be either a single layer or a stacked structure of a plurality of layers. In addition to a metal film or a metal oxide film, metal nitride or metal oxynitride can also be used. The separation layer 702 can be formed by a sputtering method or a CVD method such as a plasma CVD method.

Examples of metals used for the separation layer 702 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like. In addition to such metal films, the separation layer 702 can also be formed using a film made of an alloy containing the above-described metal as a main component or a compound containing the above-described metal.

Alternatively, the separation layer 702 may be formed using a film formed of only a silicon (Si) or a film formed of a compound containing silicon (Si) as a main component. As a further alternative, the separation layer 702 may be formed using a film formed of an alloy of silicon (Si) and any of the above-described metals. A film containing silicon may be any of amorphous, microcrystalline, or polycrystalline.

The separation layer 702 may be either a single layer of the above-described film or stacked layers thereof. The separation layer 702 having a stack of a metal film and a metal oxide film can be formed by forming a base metal film and then, oxidizing or nitriding the surface of the metal film. Specifically, plasma treatment may be applied to the base metal film in an oxygen atmosphere or a nitrogen oxide atmosphere, or thermal treatment may be applied to the metal film in an oxygen atmosphere or a nitrogen oxide atmosphere. Alternatively, the metal film can be oxidized by forming a silicon oxide film or silicon oxynitride film so as to be in contact with the base metal film. Further alternatively, the metal film can be nitrided by forming a silicon nitride oxide film or a silicon nitride film so as to be in contact with the base metal film.

As a plasma treatment which oxidizes or nitrides a metal film, a high-density plasma treatment in which a plasma density is greater than or equal to $1 \times 10^{11}$ cm$^{-3}$ or preferably in the range of $1 \times 10^{11}$ cm$^{-3}$ to $9 \times 10^{15}$ cm$^{-3}$ and which uses a high frequency wave such as a micro wave (for example, a frequency is 2.45 GHz) may be performed.

Note that the separation layer 702 in which a metal film and a metal oxide film are stacked may be formed by oxidizing a surface of the base metal film; however, a metal oxide film may be separately formed after a metal film has been formed. In a case of using tungsten as a metal, for example, a tungsten film is formed as the base metal film by a sputtering method, a CVD method, or the like, and then the tungsten film is subjected to plasma treatment. Accordingly, the tungsten film corresponding to the metal film and a metal oxide film which is in contact with the metal film and formed of an oxide of tungsten can be formed.

Note that an oxide of tungsten is expressed by WO$_x$, and x is in the range of 2 to 3. There are cases where x is 2 (WO$_2$), 2.5 (W$_2$O$_5$), 2.75 (W$_4$O$_{11}$), 3 (WO$_3$), or the like. In a case of forming an oxide of tungsten, there are no particular limitations on the value of x and the value of x may be set based on an etching rate or the like.

It is preferable that the semiconductor film 704 be consecutively formed after the formation of the insulating film 703 without exposure to air. The thickness of the semiconductor film 704 is 20 to 200 nm (preferably 40 to 170 nm, or more preferably 50 to 150 nm). The semiconductor film 704 may be an amorphous semiconductor, a semiamorphous semiconductor, or a polycrystalline semiconductor. Not only silicon but also silicon germanium can be used as the semiconductor. In the case of using silicon germanium, it is preferable that a concentration of germanium be approximately 0.01 atomic % to 4.5 atomic %

Note that a semi-amorphous semiconductor includes a semiconductor having an intermediate structure between an amorphous semiconductor and a semiconductor having a crystalline structure (including single crystal and polycrystal). The semi-amorphous semiconductor is a semiconductor having a third state which is stable in free energy, is a crystalline substance with a short-range order and lattice distortion, and can be dispersed in a non-single crystalline semiconductor with a grain size of 0.5 to 20 nm. Raman spectrum of the semi-amorphous semiconductor film shifts to a wave number side lower than 520 cm$^{-1}$, and the diffraction peaks of (111) and (220) which are said to be derived from a silicon crystalline lattice are observed by X-ray diffraction. Further, the semi-amorphous semiconductor contains hydrogen or halogen of at least 1 atomic % or more to terminate dangling bonds. Here, such a semiconductor is referred to as a semi-amorphous semiconductor (SAS) for convenience. When a rare gas element such as helium, argon, krypton, or neon is contained to further increase the lattice distortion, stability can be enhanced, and a favorable semi-amorphous semiconductor can be obtained.

In addition, the SAS can be obtained by glow discharge decomposition of a gas containing silicon. As a typical gas containing silicon, SiH$_4$, or Si$_2$H$_6$, SiH$_2$Cl$_2$, SiHCl$_3$, SiCl$_4$, SiF$_4$, or the like can be used. Further, when the gas containing silicon is diluted with hydrogen or with a gas in which one or more of rare gas elements of helium, argon, krypton, and neon are added to hydrogen, the SAS can be easily formed. The gas containing silicon is preferably diluted at a dilution ratio in the range of 2 to 1000 times. Further, a carbide gas such as CH$_4$ or C$_2$H$_6$; a germanium gas such as GeH$_4$ or GeF$_4$; F$_2$; or the like may be mixed into the gas containing silicon to adjust the energy bandwidth to be 1.5 to 2.4 eV or 0.9 to 1.1 eV.

For example, in the case of using a gas in which H$_2$ is added to SiH$_4$ or a gas in which F$_2$ is added to SiH$_4$, the subthreshold coefficient (S value) of the TFT can be less than or equal to 0.35 V/dec, typically 0.25 to 0.09 V/dec, and the mobility can be 10 cm$^2$/Vsec when the TFT is manufactured using the formed semi-amorphous semiconductor.

Note that the semiconductor film 704 may be crystallized by a known technique. As the known technique of crystallization, a laser crystallization method using a laser beam and a crystallization method using a catalytic element are given. Alternatively, a crystallization method using a catalyst element and a laser crystallization method can be combined. In the case of using a thermally stable substrate such as quartz for the substrate 700, it is possible to combine any of the following crystallization methods: a thermal crystallization method with an electrically heated oven, a lamp anneal crystallization method with infrared light, a crystallization method with a catalytic element, and high temperature annealing at about 950° C.

For example, in the case of using laser crystallization, thermal treatment at 550° C. is applied to the semiconductor film 704 for four hours before the laser crystallization, in order to enhance the resistance of the semiconductor film 704 to laser. By using a solid state laser capable of continuous oscillation and irradiating the semiconductor film 704 with laser light of a second to fourth harmonic of a fundamental wave, large grain crystals can be obtained. Typically, a second harmonic (532 nm) or a third harmonic (355 nm) of a Nd:YVO$_4$ laser (a fundamental wave of 1064 nm) is desirably used. Specifically, laser light emitted from a continuous-wave YVO$_4$ laser is converted into a harmonic by using a non-linear optical element, thereby obtaining laser light of which output is 10 W. Then, the laser light is preferably shaped into a rectangular shape or an elliptical shape with optics on the irradiation surface. The power density of approximately 0.01 to 100 MW/cm$^2$ (preferably, 0.1 to 10 MW/cm$^2$) is required for the laser. In addition, the scan rate is set at approximately 10 to 2000 cm/sec.

Note that as a continuous oscillation gas laser, an Ar laser, a Kr laser, or the like can be used. As a continuous-wave solid-state laser, the following can be used: a YAG laser, a YVO$_4$ laser, a YLF laser, a YAlO$_3$ laser, a forsterite (Mg$_2$SiO$_4$) laser, a GdVO$_4$ laser, a Y203 laser, a glass laser, a ruby laser, an alexandrite laser, a Ti:sapphire laser, and the like.

As a pulse-oscillation laser, an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper-vapor laser, or a gold-vapor laser can be used.

The repetition rate of pulsed laser light may be set at 10 MHz or higher, so that laser crystallization may be performed with a considerably higher frequency band than the normally used frequency band in the range of several ten to several hundred Hz. It is estimated that the time it takes for the semiconductor film 704 to completely solidify after being irradiated with pulsed oscillation laser light and melted is several tens to several hundreds of nanoseconds. Therefore, by using the above frequency band, the first semiconductor film 704 can be irradiated with a laser beam of the next pulse until the first semiconductor film 704 is solidified after being melted by a laser beam of the preceding pulse. Accordingly, the solid-liquid interface in the semiconductor film 704 can be moved continuously and thus, the semiconductor film 704 having crystal grains that have grown in the scanning direction can be formed. Specifically, an aggregation of crystal grains each having a width of 10 to 30 μm in the scanning direction of the crystal grains and a width of approximately 1 to 5 μm in a direction perpendicular to the scanning direction can be formed. By forming single crystals with crystal grains that have continuously grown in the scanning direction, it is possible to form the semiconductor film 704 having few crystal grains at least in the channel direction of a TFT.

Note that the laser crystallization may be performed by irradiation with continuous wave laser light of a fundamental wave and continuous wave laser light of a harmonic in parallel or irradiation with continuous wave laser light of a fundamental wave and pulse-oscillation laser light of a harmonic in parallel.

Laser light irradiation may be performed in an inert gas atmosphere such as in a rare gas or nitrogen. By performing laser light irradiation in an inert gas atmosphere, roughness of a semiconductor surface caused by the laser light irradiation can be suppressed, and variation in a threshold voltage caused by variation in an interface state density can be suppressed.

By the above-described laser irradiation, the semiconductor film 704 with enhanced crystallinity can be formed. Note that it is also possible to use a polycrystalline semiconductor, which is formed by a sputtering method, a plasma CVD method, a thermal CVD method, or the like, for the semiconductor film 704.

The semiconductor film 704 is crystallized in this embodiment; however, an amorphous semiconductor film or a microcrystalline semiconductor film may be subjected to a process described below directly, without being crystallized. A TFT formed using an amorphous semiconductor or a microcrystalline semiconductor needs less fabrication steps than TFTs formed using a polycrystalline semiconductor. Therefore, it has an advantage of low cost and high yield.

An amorphous semiconductor can be obtained by glow discharge decomposition of a gas containing silicon. As examples of the gas containing silicon, SiH$_4$, Si$_2$H$_6$, and the like can be given. The gas containing silicon diluted with hydrogen or hydrogen and helium may be used.

Next, the semiconductor film 704 is subjected to channel doping, in which an impurity element which imparts p-type conductivity or an impurity element which imparts n-type conductivity is added at a low concentration. The channel doping may be performed to the whole semiconductor film 704 or part of the semiconductor film 704. As the impurity element which imparts p-type conductivity, boron (B), aluminum (Al), gallium (Ga), or the like can be used. As the impurity element imparting n-type conductivity, phosphorus (P), arsenic (As), or the like can be used. Here, boron (B) is used as the impurity element and added at a concentration of $1\times10^{16}$ to $5\times10^{17}$/cm$^3$.

Figure 11B:
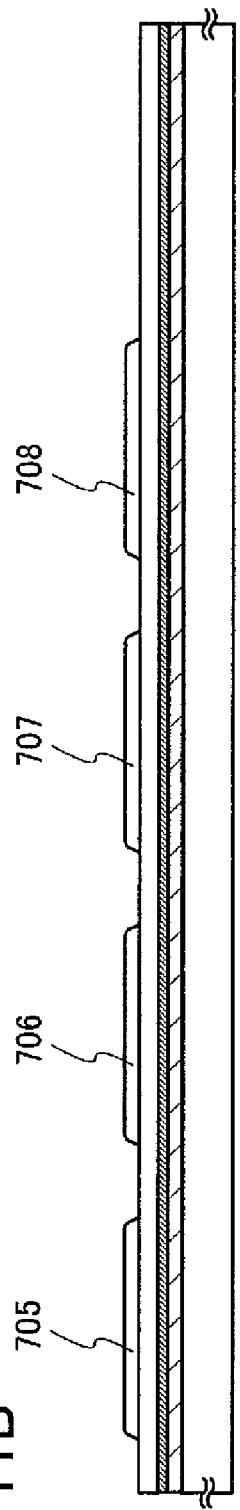
Figure 11C:
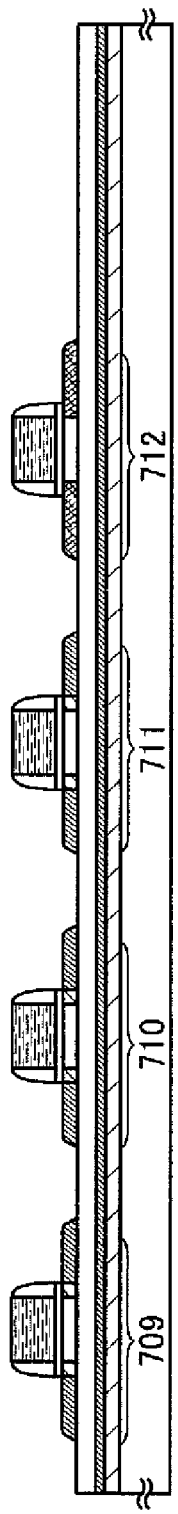

Next, as shown in FIG. 11B, the semiconductor film 704 is processed (patterned) into a predetermined shape, so that island-shaped semiconductor films 705 to 708 are formed. Then, as shown in FIG. 11C, TFTs 709 to 712 using the island-shaped semiconductor films 705 to 708 are formed. Note that the TFTs 709 to 712 can be formed by a known method.

Next, as shown in FIG. 12A, an insulating film 713 is formed so as to cover the TFTs 709 to 712. Although the insulating film 713 is not always necessary, when the insulating film 713 is formed, impurities such as alkali metal and alkaline earth metal are prevented from entering the TFTs 709 to 712. Specifically, it is preferable to use silicon nitride, silicon nitride oxide, aluminum nitride, aluminum oxide, silicon oxide, or the like as the insulating film 713. In this embodiment, a silicon oxynitride film with a thickness of about 600 nm is used as the insulating film 713. In this case, a hydrogenation step may be performed after the formation of this silicon oxynitride film.

Next, an insulating film 714 is formed over the insulating film 713 so as to cover the TFTs 709 to 712. An organic material having heat resistance, such as polyimide, acrylic, benzocyclobutene, polyamide, or epoxy can be used for the insulating film 714. Alternatively, a low-dielectric constant material (Low-k material), a siloxane-based resin, silicon oxide, silicon nitride, silicon oxynitride, silicon nitride oxide, PSG (phosphosilicate glass), BPSG (borophosphosilicate glass), alumina, or the like can be used besides the above organic materials. A siloxane-based resin may contain as a substituent at least one of fluorine, an alkyl group, and aromatic hydrocarbon, in addition to hydrogen. Note that the insulating film 714 may be formed in such a manner that a plurality of insulating films formed of any of the above-described materials is stacked.

The insulating film 714 can be formed by a CVD method, a sputtering method, an SOG method, spin coating, dipping, spray coating, a droplet discharge method (an ink-jet method, screen printing, offset printing, or the like), a doctor knife, a roll coater, a curtain coater, a knife coater, or the like depending on a material of the insulating film 714.

Next, opening portions are formed in the insulating film 713 and the insulating film 714 such that each of the island-shaped semiconductor films 705 to 708 is partly exposed. Then, conductive films 725 to 732 which are in contact with the island-shaped semiconductor films 705 to 708 through the opening portions are formed. As a gas for etching to form the opening portions, a mixed gas of CHF$_3$ and He is used; however, the present invention is not limited thereto.

The conductive films 725 to 732 may be formed by a CVD method, a sputtering method, or the like. Specifically, the conductive films 725 to 732 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 725 to 732 can be either a single layer of the above-described metal film or a plurality of stacked layers thereof.

As an example of an alloy containing aluminum as a main component, an alloy which contains aluminum as a main component and nickel can be given. Further, an alloy which contains aluminum as a main component and contains nickel and one or both of carbon and silicon can also be given. Aluminum and aluminum silicon, which have a low resistance value and are inexpensive, are the most suitable materials for formation of the conductive films 725 to 732. In particular, when an aluminum silicon (Al—Si) film is used, generation of hillocks in resist baking can be suppressed more than the case of using an aluminum film, in patterning the conductive films 725 to 732. Further, instead of silicon (Si), Cu may be mixed into an aluminum film at about 0.5 wt. %.

Each of the conductive films 725 to 732 may be formed to have a stacked structure of, for example, a barrier film, an aluminum silicon (Al—Si) film, and a barrier film, or a stacked structure of a barrier film, an aluminum silicon (Al—Si) film, a titanium nitride film, and a barrier film. Note that a barrier film is a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be prevented more effectively. Further, when a barrier film is formed using titanium, which is a highly reducible element, even if a thin oxide film is formed over the island-shaped semiconductor films 705 to 708, the oxide film is reduced by titanium contained in the barrier film so that good contact between the conductive films 725 to 732 and the island-shaped semiconductor films 705 to 708 can be obtained. Alternatively, a plurality of barrier films may be stacked to be used. In that case, the conductive films 725 to 732 can each have a five-layer structure in which titanium, titanium nitride, aluminum silicon, titanium, and titanium nitride are sequentially stacked from the bottom.

The conductive films 725 and 726 are connected to high concentration impurity regions 715 of the n-channel TFT 709. The conductive films 727 and 728 are connected to high concentration impurity regions 716 of the n-channel TFT 710. The conductive films 729 and 730 are connected to high concentration impurity regions 717 of the n-channel TFT 711. The conductive films 731 and 732 are connected to high-concentration impurity regions 718 of the n-channel TFT 712.

As shown in FIG. 12B, after forming a protective layer 740 over the insulating film 714 so as to cover the conductive films 725 to 732, a sheet material 741 is attached to the protective layer 740. The protective layer 740 is formed of a material by which the insulating film 714 and the conductive film 725 to 732 can be protected at the time of separating the substrate 700 with the separation layer 702 used as a boundary later. For example, the protective layer 740 can be formed by applying an epoxy-based, acrylate-based, or silicone-based resin that is soluble in water or alcohols over the entire surface.

In this embodiment, the protective layer 740 is formed in the following manner: a water-soluble resin (manufactured by Toagosei Co., Ltd.: VL-WSHL10) is applied to a thickness of 30 μm over the insulating film 714 and the conductive films 725 to 732 by a spin coating method and exposed for 2 minutes so that it is temporarily hardened. Then, the resin is exposed to UV light for a total of 12.5 minutes, including 2.5 minutes of exposure from a back surface and 10 minutes of exposure from a front surface, to fully harden the resin and thus form the protective layer 740. Further, in the case of stacking a plurality of organic resins, depending on a solvent used, the stacked organic resins might be partly melted or adhesiveness might become too high during application or baking. Therefore, in the case where organic resins that are soluble in the same solvent are used for the insulating film 714 and the protective layer 740, it is preferable to form an inorganic insulating film (e.g., a silicon nitride film, a silicon nitride oxide film, an $AlN_x$ film, or an $AlN_xO_y$ film) so as to cover the insulating film 714 in order that the protective layer 740 can be smoothly removed in a later step.

Next, as shown in FIG. 12C, a layer of from the insulating film 703 up to the conductive films 725 to 732 formed over the insulating film 714, which includes semiconductor elements typified by TFTs and various conductive films, (hereinafter referred to as an "element layer 742"), the protective layer 740, and the sheet material 741 are separated from the substrate 700. In this embodiment, the element layer 742 and the protective layer 740 are separated from the substrate 700 by physical force. The separation layer 702 does not need to be completely removed and may be partly left. The separation above can be performed by being pulled by a human hand or a gripping tool, or by being detached while rolling a roller thereon.

In this embodiment, although a separation step in which the metal oxide film is used as the separation layer to separate the element layer 742 by a physical method is performed, a separation step performed in the present invention is not limited thereto. For example, the substrate 700 having a light-transmitting property may be used and amorphous silicon containing hydrogen may be used as the separation layer 702 in order that the separation layer 702 is irradiated with a laser beam from the substrate 700 side to vaporize the hydrogen contained in amorphous silicon and separate the substrate 700 from the element layer 742.

As the above-described separation step, a method of etching the separation layer 702 may be performed. In this case, a groove is formed so as to partly expose the separation layer 702. The groove is formed by dicing, scribing, processing using laser light including UV light, a photolithography method, or the like. It is only necessary that the groove be deep enough to expose the separation layer 702. A halogen fluoride is used as an etching gas, and the gas is introduced through the groove. In this embodiment, for example, $ClF_3$ (chlorine trifluoride) is used for etching in accordance with the following condition: a temperature of 350° C., a flow rate of 300 sccm, a pressure of 800 Pa, and a processing time of 3 hours. In addition, nitrogen may be mixed into the $ClF_3$ gas. Using halogen fluoride such as $ClF_3$ enables the separation layer 702 to be etched as selected, so that the substrate 700 can be separated from the element formation layer 742. Further, the halogen fluoride may be either a gas or a liquid.

The element layer 742 can be separated from the substrate 700 by a removing method in which a substrate is mechanically polished or a removing method in which a substrate is dissolved by a solution such as HF. In this case, the separation layer 702 is not necessary.

Next, as shown in FIG. 13A, a supporting substrate 743 is attached to a surface on the side which is exposed by the separation of the element layer 742. Then, after the element layer 742 and the protective layer 740 are separated from the sheet material 741, the protective layer 740 is removed.

As the supporting substrate 743, for example, a glass substrate such as barium borosilicate glass, or aluminoborosilicate glass, a flexible organic material such as paper or plastic can be used. Alternatively, as the supporting substrate 743, a flexible inorganic material can be used. The plastic substrate may be made of ARTON including poly-norbornene that has a polar group (manufactured by JSR). In addition, polyester typified by polyethylene terephthalate (PET); polyether sulfone (PES); polyethylene naphthalate (PEN); polycarbonate (PC); polyamide resin; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin; and the like can be given.

Next, a conductive film which is to be a pixel electrode 745 later is formed so as to cover the insulating film 714 and the conductive films 725 to 732. In this embodiment, the light-transmitting conductive film is formed from indium tin oxide containing silicon oxide (ITSO) by a sputtering method. As well as ITSO, a light-transmitting oxide conductive material other than ITSO, such as indium tin oxide (ITO), zinc oxide (ZnO), indium zinc oxide (IZO), or gallium-doped zinc oxide (GZO) may be used for the conductive film. Alternatively, as the conductive film, other than the above-described light-transmitting oxide conductive material, a single-layer film containing one or more of titanium nitride, zirconium nitride, Ti, W, Ni, Pt, Cr, Ag, Al, and the like, a stacked layer of a titanium nitride film and a film containing aluminum as a main component, a three-layer structure of a titanium nitride film, a film containing aluminum as a main component, and a titanium nitride film, or the like can be used. Note that in the case where light is extracted from the pixel electrode 745 side by using a material other than the light-transmitting oxide conductive material, the conductive material is formed to a thickness (preferably approximately 5 nm to 30 nm) which lets light transmits through the conductive film.

In the case where ITSO is used, a target in which silicon oxide is contained in ITO at 2 wt. % to 10 wt. % can be used. Specifically, in this embodiment, by using a target in which $In_2O_3$, $SnO_2$, and $SiO_2$ are contained at a wt. % ratio of 85:10:5, the conductive film is formed to a thickness of 105 nm, with a flow rate of Ar at 50 sccm, a flow rate of $O_2$ at 3 sccm, a sputtering pressure of 0.4 Pa, a sputtering power of 1 kW, and a deposition rate of 30 nm/min.

A conductive composition including a conductive high molecule (also referred to as a conductive polymer) can be used for the conductive film which is to be the pixel electrode 745. The conductive composition preferably has sheet resistance of equal to or less than 10000 Ω/square and light transmittance of equal to or higher than 70% at a wavelength of 550 nm. Further, resistance of a conductive high molecule which is included in the conductive composition is preferably equal to or lower than 0.1 Ω·cm.

As a conductive high molecule, so-called π electron conjugated conductive high molecule can be used. For example, as π electron conjugated conductive high molecule, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

Any of the foregoing conductive high molecules may be used alone for the pixel electrode 745 as a conductive composition. Alternatively, any of the foregoing conductive high molecules can be used with an organic resin added thereto to adjust film characteristics such as uniformity of the thickness of a conductive composition film and the intensity of the film of a conductive composition.

As for the organic resin, as long as a resin is compatible with a conductive high molecule or a resin can be mixed and dispersed into a conductive high molecule, a thermosetting resin, a thermoplastic resin, or a photocurable resin may be used. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 66, polyamide 12, or polyamide 11; a fluorine resin such as poly(vinylidene fluoride), polyvinyl fluoride, polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive high molecule may be changed in order to adjust conductivity of the conductive composition.

As an acceptor dopant, a halogen compound, a Lewis acid, a protonic acid, an organic cyano compound, an organic metal compound, or the like can be used. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid are inorganic acid such as hydrochloric acid, sulfuric acid, nitric acid, phosphoric acid, fluoroboric acid, hydrofluoric acid, and perchloric acid, and organic acid such as organic carboxylic acid and organic sulfonic acid. As organic carboxylic acid and organic sulfonic acid, a organic carboxylic acid compound and an organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As a donor dopant, alkali metal, alkaline earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, an aromatic-based solvent) so that a thin film which is to be the pixel electrode 745 can be formed by a wet process.

There are no particular limitations on kinds of solvent which dissolves a conductive composition. A solvent which dissolves the foregoing conductive high molecules and high molecular resin compounds such as an organic resin may be used. For example, a conductive composition may be dissolved in any one of or mixture of water, methanol, ethanol, Propylene carbonate, N-methylpyrrolidone, dimethylformamide, dimethylacetamide, cyclohexanone, acetone, methyl ethyl ketone, methyl isobutyl ketone, or toluene.

After the conductive composition is dissolved in a solvent as described above, a film thereof can be formed by a wet process, such as an application method, a coating method, a droplet discharge method (also referred to as an inkjet method), or a printing method. The solvent may be dried with thermal treatment or may be dried under reduced pressure. In the case where the organic resin is a thermosetting resin, thermal treatment may be further performed. In the case where the organic resin is a photocurable resin, light irradiation treatment may be performed.

After the conductive film is formed, the surface thereof may be polished by a CMP method, cleaning with a polyvinyl alcohol series porous body, or the like so as to flatten the surface.

Next, as shown in FIG. 13B, the conductive film is patterned to form the pixel electrode 745 which is connected to the conductive film 732. A partition wall 750 including opening portions is formed over the insulating film 714 so as to cover the conductive films 725 to 732 and part of the pixel electrode 745. Part of the pixel electrode 745 is exposed in the opening portion of the partition wall 750. The partition wall 750 can be formed by an organic resin film, an inorganic insulating film, or a siloxane-based insulating film. For example, acrylic, polyimide, polyamide, or the like can be used as the organic resin film, and silicon oxide, silicon nitride oxide, or the like can be used as the inorganic insulating film. In particular, by using a photosensitive organic resin film as the partition wall 750 and forming opening portions over the pixel electrode 745 so as to make side walls of the opening portions have inclined surfaces of consecutive curvature, the pixel electrode 745 and a common electrode 746 which is to be formed later can be prevented from being connected to each other. In this case, a mask can be formed by a droplet discharge method or a printing method. Meanwhile, the partition wall 750 itself can be formed by a droplet discharge method or a printing method.

Next, before an electroluminescent layer 751 is formed, thermal treatment under an atmosphere or thermal treatment (vacuum bake) under a vacuum atmosphere is performed to remove moisture, oxygen, or the like adsorbed in the partition wall 750 and the pixel electrode 745. Specifically, thermal treatment is performed on a substrate at 200° C. to 450° C., preferably 250° C. to 300° C. for approximately 0.5 to 20 hours in a vacuum atmosphere. Pressure is preferably equal to or lower than $3 \times 10^{-7}$ Torr, and $3 \times 10^{-8}$ Torr is most preferable if possible. Further, in the case where the electroluminescent layer 751 is formed after thermal treatment is performed in a vacuum atmosphere, the reliability can be further improved by putting the substrate in the vacuum atmosphere just before completion of formation of the electroluminescent layer 751. Further, the pixel electrode 745 may be irradiated with ultraviolet rays before or after the vacuum baking.

The electroluminescent layer 751 is formed so as to be in contact with the pixel electrode 745 through the opening portions of the partition wall 750. The electroluminescent layer 751 may be either a single-layer structure or a stacked structure of a plurality of layers. Not only an organic material but also an inorganic material may be included in each layer. The luminescence in the electroluminescent layer 751 includes light emission (fluorescence) which is obtained in returning from a singlet-excited state to a ground state, and light emission (phosphorescence) which is obtained in returning from a triplet-excited state to a ground state. In the case where the electroluminescent layer 751 is formed of a plurality of layers, an electron injecting layer, an electron transporting layer, a light-emitting layer, a hole transporting layer, and a hole injecting layer are stacked in this order over the pixel electrode 745 which corresponds to a cathode. Note that when the pixel electrode 745 corresponds to an anode, the electroluminescent layer 751 is formed by stacking a hole injecting layer, a hole transporting layer, a light-emitting layer, an electron transporting layer, and an electron injecting layer in this order.

Alternatively, the electroluminescent layer 751 can be formed by using any of a high molecular organic compound, an intermediate molecular organic compound (an organic compound having no sublimation property, in which the length of a chain of molecules is equal to or less than 10 μm), a low molecular organic compound, and an inorganic compound by droplet discharge method. Moreover, the intermediate molecular organic compound, the low molecular organic compound, and the inorganic compound can be formed by a vapor deposition method.

The common electrode 746 is formed so as to cover the electroluminescent layer 751. As the common electrode 746, a metal, an alloy, an electrical conductive compound, a mixture thereof having a small work function, or the like can be typically used. Specifically, an alkali metal such as Li or Cs, an alkaline earth metal such as Mg, Ca, or Sr, an alloy containing them (e.g., Mg:Ag or Al:Li), or a rare earth metal such as Yb or Er can be formed as well. Further, by formation of a layer containing a material having high electron injection properties so as to be in contact with the common electrode 746, a normal conductive film formed of aluminum, a light-transmitting oxide conductive material, or the like can be used as well.

A light-emitting element 760 is formed by overlap of the pixel electrode 745, the electroluminescent layer 751, and the common electrode 746 in the opening portion in the partition wall 750.

Note that light from the light-emitting element 760 can be extracted from the pixel electrode 745 side, the common electrode 746 side, or both sides. In accordance with an objective structure among the three structures described above, a material and a thickness of each of the pixel electrode 745 and the common electrode 746 is selected. In the case where light is extracted from the common electrode 746 side as in this embodiment, higher luminance can be obtained with lower power consumption than that in the case where light is extracted from the pixel electrode 745 side.

Note that an insulating film may be formed over the common electrode 746 after the formation of the light-emitting element 760. The insulating film is formed of a film which transmits a less substance that causes promotion in deterioration of a light-emitting element, such as moisture or oxygen compared with another insulating film. Typically, a DLC film, a carbon nitride film, a silicon nitride film formed by an RF sputtering method, or the like is preferably used. Further, the above-described film through which a matter which causes increase of deterioration of a light-emitting element such as moisture or oxygen penetrates in lesser amount and a film through which the matter such as moisture or oxygen penetrates in more amount may be stacked to be used as the above-described insulating film as well.

In practice, when a process is completed up to and including FIG. 13B, packaging (filling and sealing) is preferably performed by using a protective film (a laminating film, an ultraviolet curable resin film, or the like) which has small degas and high airtightness so as not to be further exposed to the outside air, or a cover member.

Through the above-described process, a display device of the present invention is manufactured.

Note that this embodiment shows an example in which the element layer 742 is used by being separated from the substrate 700; however, the aforementioned element layer 742 is formed over the substrate 700 without providing the separation layer 702, and may be used as a display device.

Note that this embodiment describes with a thin film transistor as an example; however, the present invention is not limited thereto. As well as a thin film transistor, a transistor formed using single-crystal silicon, a transistor formed using SOI, or the like can be used. Alternatively, a transistor using an organic semiconductor, and a transistor using a carbon nanotube may be used.

This embodiment can be implemented by being combined as appropriate with any of the above-described embodiment modes.

[Embodiment 2]

In this embodiment, a manufacturing method of a display device of the present invention, in which a semiconductor element is formed by using a semiconductor film which is transferred from a semiconductor substrate (a bond substrate) to a supporting substrate (a base substrate), will be described.

Figure 14A:
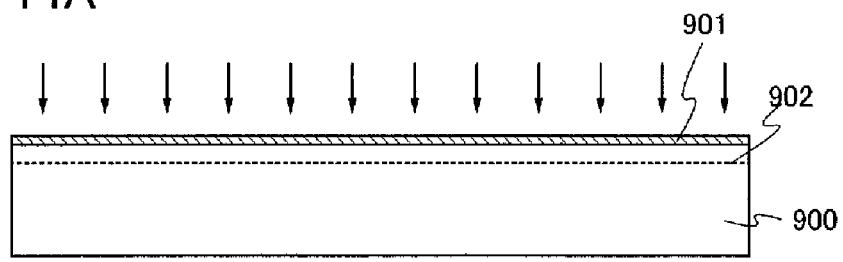
FIGS. 14A to 14D are diagrams illustrating a manufacturing method of a display device of the present invention.

First, as shown in FIG. 14A, an insulating film 901 is formed over a bond substrate 900. The insulating film 901 is formed using an insulating material such as silicon oxide, silicon nitride oxide, or silicon nitride. The insulating film 901 can be either a single insulating film or stacked layers of a plurality of insulating films. For example, in this embodiment, the insulating film 901 is used in which, from the bond substrate 900 side, silicon nitride oxide in which the amount of oxygen is higher than that of nitrogen, and silicon nitride oxide in which the amount of nitrogen is higher than that of oxygen are stacked.

For example, in the case of using silicon oxide as the insulating film 901, the insulating film 901 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, the surface of the insulating film 901 may be densified with oxygen plasma treatment. In the case of using silicon nitride as the insulating film 901, the insulating film 901 can be formed using a mixed gas of silane and ammonium by a vapor deposition method such as plasma CVD. In addition, in the case of using silicon nitride oxide as the insulating film 901, the insulating film 901 can be formed using a mixed gas of silane and ammonium or a mixed gas of silane and nitrogen oxide by a vapor deposition method such as plasma CVD.

Alternatively, the insulating film 901 may be formed using silicon oxide which is formed with the use of an organic silane gas by a chemical vapor deposition method. Examples of organic silane gas that can be used include silicon-containing compounds, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

Next, as shown in FIG. 14A, hydrogen or a rare gas, or hydrogen ions or rare gas ions is introduced into the bond substrate 900 as indicated by arrows, whereby a defect layer 902 having very small voids is formed in a region at a certain depth from a surface of the bond substrate 900. The position where the defect layer 902 is formed is determined depending on acceleration voltage at the time of the above-described introduction. The thickness of a semiconductor film 908 which is transferred from the bond substrate 900 to the base substrate 904 is determined by the position of the defect layer 902; therefore, acceleration of the voltage at the time of the introduction is performed in consideration of the thickness of the semiconductor film 908. The semiconductor film 908 is formed to a thickness of 10 nm to 200 nm, preferably 10 nm to 50 nm. For example, in the case where hydrogen is introduced into the bond substrate 900, the dose is desirably $1\times10^{16}/cm^2$ to $1\times10^{17}/cm^2$.

Note that, in some cases, in the step of forming the defect layer 902, hydrogen or a rare gas, or hydrogen ions or rare gas ions is introduced into the bond substrate 900 at high concentration, and accordingly a surface of the bond substrate 900 may become rough and sufficient bond strength for attachment between the base substrate 904 and the bond substrate 900 may not be able to be obtained. The insulating film 901 is provided, whereby the surface of the bond substrate 900 is protected at the time of the introduction of hydrogen or a rare gas, or hydrogen ions or rare gas ions, and the base substrate 904 and the bond substrate 900 can be bonded to each other well.

Figure 14B:
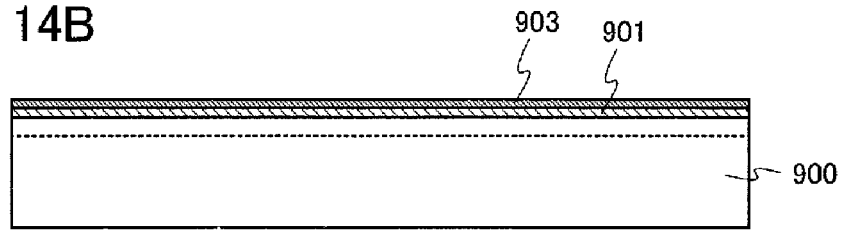

Next, as shown in FIG. 14B, an insulating film 903 is formed over the insulating film 901. Like the insulating film 901, the insulating film 903 is formed using an insulating material such as silicon oxide, silicon nitride oxide, or silicon nitride. The insulating film 903 can be either a single insulating film or stacked layers of a plurality of insulating films. Alternatively, the insulating film 903 may be formed using silicon oxide which is formed with the use of an organic silane gas by a chemical vapor deposition method. In this embodiment, the insulating film 903 may be formed using silicon oxide which is formed with the use of an organic silane gas by a chemical vapor deposition method.

When an insulating film with a high barrier property, such as silicon nitride or silicon nitride oxide, is used as the insulating film 901 or the insulating film 903, impurities such as an alkali metal or an alkaline earth metal included in the base substrate 904 can be prevented from entering into a semiconductor film 909 which is to be formed later.

Note that in this embodiment, although the insulating film 903 is formed after the defect layer 902 is formed, the insulating film 903 is not always necessary. However, since the insulating film 903 is formed after the defect layer 902 is formed, flatness of the surface of the insulating film 903 is higher than that of the insulating film 901 which is formed before the defect layer 902 is formed. Therefore, when the insulating film 903 is formed, bonding to be performed later can be further strengthened.

Next, before the bond substrate 900 and the base substrate 904 are attached to each other by bonding, hydrogenation may be performed on the bond substrate 900. The hydrogenation is performed for example, at 350° C. for approximately two hours in a hydrogen atmosphere.

Figure 14C:
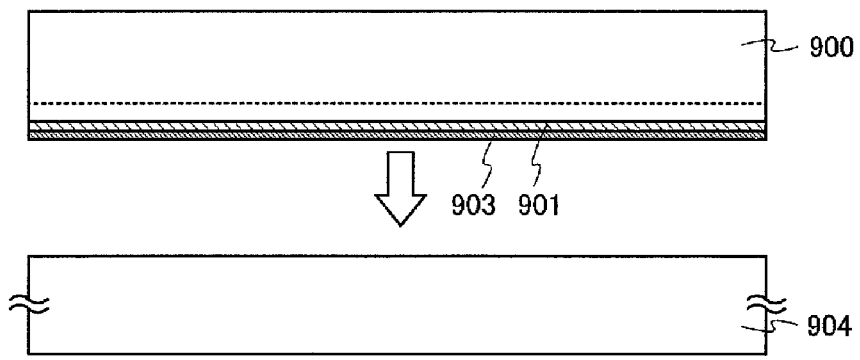
Figure 14D:
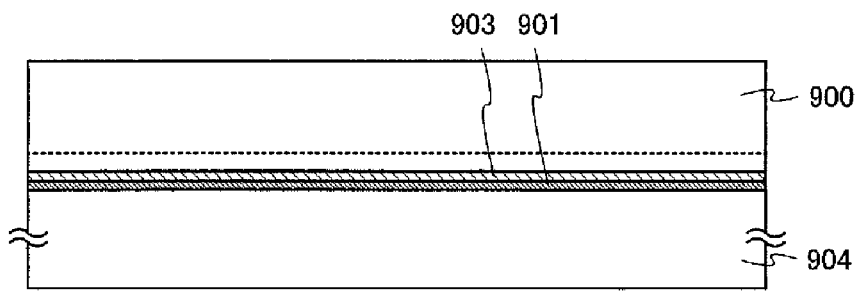

Next, as shown in FIG. 14C, the bond substrate 900 is stacked over the base substrate 904 so that the insulating film 903 is interposed therebetween. Then, the bond substrate 900 and the base substrate 904 are attached to each other, as shown in FIG. 14D. The insulating film 903 is bonded to the base substrate 904, whereby the bond substrate 900 and the base substrate 904 are attached to each other.

The bond substrate 900 and the base substrate 904 are bonded to each other by van der Waals forces, so that they are firmly bonded to each other even at room temperature. Note that since the above-described bonding can be performed at a low temperature, various substrates can be used for the base substrate 904. As the base substrate 904, for example, a substrate such as a quartz substrate or a sapphire substrate can be used as well as a glass substrate made of aluminosilicate glass, barium borosilicate glass, aluminoborosilicate glass. Furthermore, as the base substrate 904, a semiconductor substrate formed of silicon, gallium arsenide, indium phosphide, or the like can be used.

Note that an insulating film is also formed over the surface of the base substrate 904 and the insulating film may be bonded to the insulating film 903. In this case, as the base substrate 904, a metal substrate such as a stainless-steel substrate can be used as well as what given above can be used. A substrate formed of a synthetic resin which has flexibility, such as plastic, generally tends to have lower allowable temperature limit than that of the above substrates; however, the substrate can be used as the base substrate 904 as long as it can resist a processing temperature in a manufacturing process. As a plastic substrate, polyester typified by polyethylene terephthalate (PET), polyether sulfone (PES), polyethylene naphthalate (PEN), polycarbonate (PC), polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like are given.

As the bond substrate 900, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 900. In addition, as the bond substrate 900, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that thermal treatment or pressure treatment may be performed after the base substrate 904 and the bond substrate 900 are attached to each other. The bond strength can be increased with thermal treatment or pressure treatment.

Figure 15A:
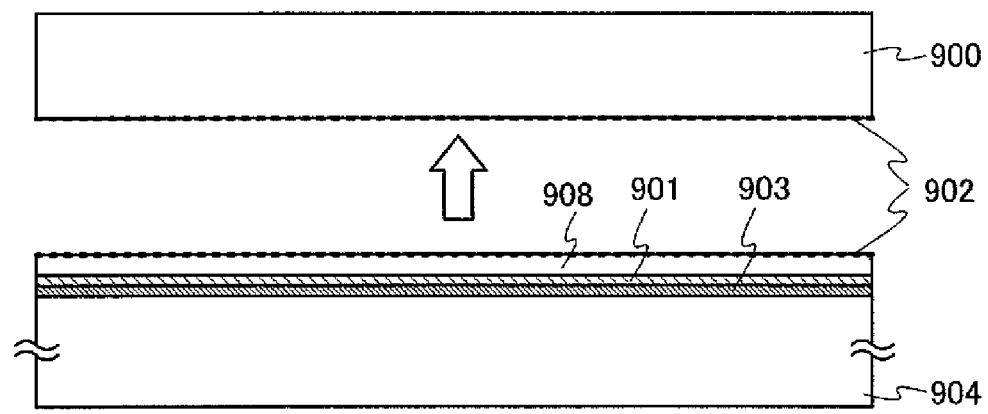
FIGS. 15A to 15C are diagrams illustrating the manufacturing method of the display device of the present invention.

Thermal treatment is performed after the above-mentioned bonding, thereby the adjacent microvoids in the defect layer 902 are coupled and the volume of the microvoid is increased. As a result, as shown in FIG. 15A, the bond substrate 900 is split along the defect layer 902; thus, the semiconductor film 908 which has been part of the bond substrate 900 is separated from the bond substrate 900. The thermal treatment is preferably performed at a temperature that is equal to or lower than the allowable temperature limit of the base substrate 904. For example, thermal treatment may be performed at a temperature ranging from 400° C. to 600° C. This separation transfers the semiconductor film 908 together with the insulating film 901 and the insulating film 903 to the base substrate 904. After that, thermal treatment at a temperature ranging from 400° C. to 600° C. is preferably performed in order to bond the insulating film 903 and the base substrate 904 to each other more strongly.

Crystalline orientation of the semiconductor film 908 can be controlled with the plane orientation of the bond substrate 900. The bond substrate 900 having crystalline orientation which is suitable for a semiconductor element which is to be formed may be selected as appropriate. Mobility of the transistor differs depending on the crystalline orientation of the semiconductor film 908. When a transistor with higher mobility is desired to be obtained, the direction of bonding of the bond substrate 900 is set in consideration of the direction of a channel and the crystalline orientation.

Next, the surface of the semiconductor film 908 transferred is flattened. Although the flattening is not necessarily essential, the flattening makes it possible to improve characteristics of the interface between the semiconductor film 908 and a gate insulating film in the transistor which is to be formed later. Specifically, the flattening can be performed by chemical mechanical polishing (CMP). The thickness of the semiconductor film 908 is reduced by the above-described flattening.

Note that although the case where a Smart Cut® method is used in which the semiconductor film 908 is separated from the bond substrate 900 by the defect layer 902 is described in this embodiment, the semiconductor film 908 may be attached to the base substrate 904 by another bonding method such as ELTRAN (epitaxial layer transfer), a dielectric isolation method, or a PACE (plasma assisted chemical etching) method.

Figure 15B:
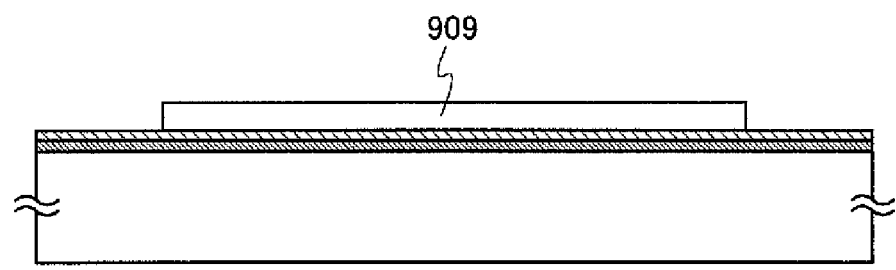

Next, as shown in FIG. 15B, the semiconductor film 908 is processed (patterned) into a predetermined shape, so that island-shaped semiconductor film 909 is formed.

Figure 15C:
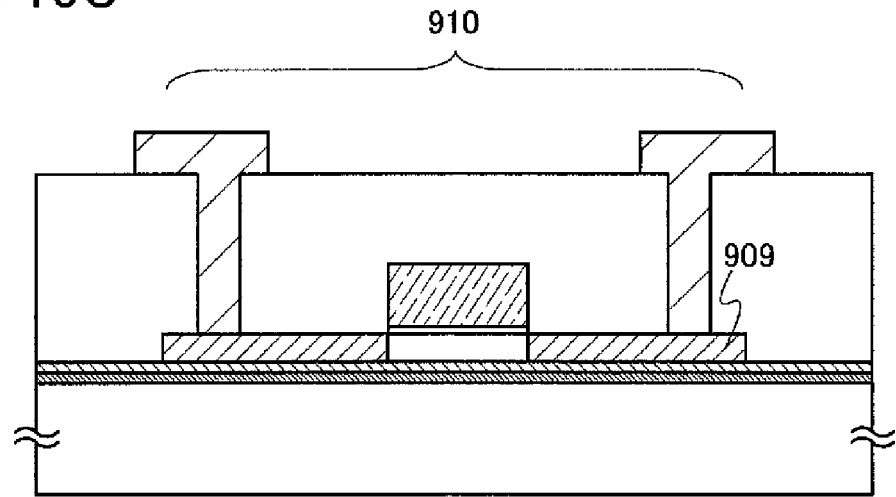

The present invention makes it possible to form various semiconductor elements such as transistors with the use of the semiconductor film 909 which is formed through the above-described steps. A transistor 910 formed using the semiconductor film 909 is illustrated in FIG. 15C.

With the above-described manufacturing method, a semiconductor element included in a display device of the present invention can be manufactured.

This embodiment can be implemented in combination with any of the above-described embodiment modes or the above-described embodiments as appropriate.

[Embodiment 3]

Figures 16A, 16B:
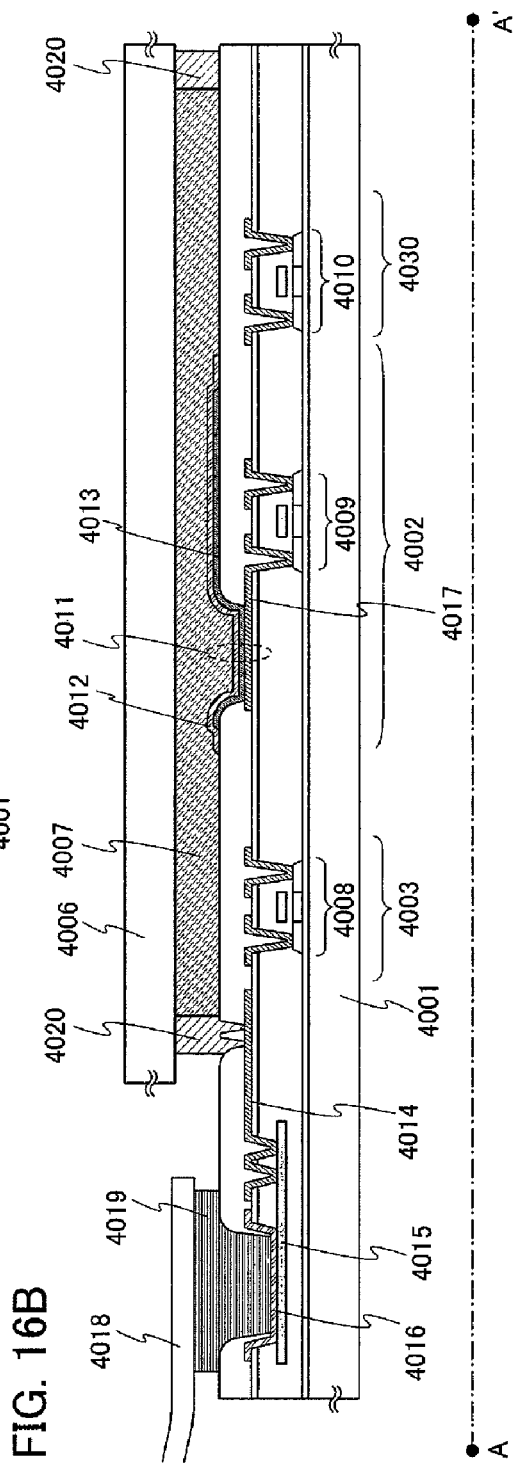
FIG. 16A is a top view of a display device of the present invention and FIG. 16B is a cross-sectional view of the display device of the present invention.

In this embodiment, the appearance of a display device of the present invention will be described with reference to FIGS. 16A and 16B. FIG. 16A is a top view of a panel in which a transistor and a light-emitting element formed over a first substrate is sealed between the first substrate and a second substrate with a sealant. FIG. 16B is a cross-sectional view of the FIG. 16A along a line A-A'.

A sealant 4020 is formed so as to surround a pixel portion 4002, a signal line driver circuit 4003, a scanning line driver circuit 4004, and a reset line driver circuit 4030 which are formed over a first substrate 4001. In addition, a second substrate 4006 is formed over the pixel portion 4002, the signal line driver circuit 4003, and the scanning line driver circuit 4004. Thus, the pixel portion 4002, the signal line driver circuit 4003, the scanning line driver circuit 4004, and the reset line driver circuit 4030 are tightly sealed together with a filler 4007 between the first substrate 4001 and the second substrate 4006 with the sealant 4020.

Each of the pixel portion 4002, the signal line driver circuit 4003, the scanning line driver circuit 4004, and the reset line driver circuit 4030 which are formed over the first substrate 4001 has a plurality of transistors. In FIG. 16B, a transistor 4008 included in the signal line driver circuit 4003, a driving transistor 4009 included in the pixel portion 4002, and a transistor 4010 included in the reset line driver circuit 4030 are illustrated.

A light-emitting element 4011 uses part of a wiring 4017 connected to a source region or a drain region of the driving transistor 4009 as a pixel electrode. In addition, the light-emitting element 4011 includes a common electrode 4012 and an electroluminescent layer 4013 as well as the pixel electrode. The structure of the light-emitting element 4011 is not limited to the one shown in this embodiment. The structure of the light-emitting element 4011 may be appropriately changed in accordance with the direction of light extracted from the light-emitting element 4011, polarity of the driving transistor 4009 and the like.

Various signals and voltages supplied to the signal line driver circuit 4003, the scanning line driver circuit 4004, the reset line driver circuit 4030, or the pixel portion 4002 are not shown in the cross-sectional view in FIG. 16B; however, they are supplied from a connection terminal 4016 via leading out wirings 4014 and 4015.

In this embodiment, the connecting terminal 4016 is formed of the same conductive film as the common electrode 4012 of the light emitting element 4011. In addition, the lead wiring 4014 is formed of the same conductive film as the wiring 4017. The leading out wiring 4015 is formed using the same conductive film as gate electrodes included in the driving transistor 4009, the transistor 4010, and the transistor 4008, respectively.

The connecting terminal 4016 is electrically connected to a terminal of an FPC 4018 through an anisotropic conductive film 4019.

Note that the first substrate 4001 and the second substrate 4006 can be formed by using glass, metal (typically stainless-steel), ceramics, or plastic. Note that the second substrate 4006 positioned in the direction for extracting light from the light-emitting element 4011 is required to have a light-transmitting property. That is, the second substrate 4006 is preferably formed by using a material having a light-transmitting property, such as a glass substrate, a plastic substrate, a polyester film, or an acrylic film.

In addition, an ultraviolet curable resin or a thermoset resin can be used for the filler 4007 as well as inert gas such as nitrogen or argon. In this embodiment, an example in which nitrogen is used as the filler 4007 is described.

This embodiment can be implemented in combination with any of the above-described embodiment modes or the above-described embodiments as appropriate.

[Embodiment 4]

A display device of the present invention can be used as a display portion included in a camera such as a video camera, or a digital still camera or an electronic device such as a mobile phone, a portable game machine, or an e-book reader. As an electronic device which can use the display device of the present invention, a goggle display (a head mounted display), a navigation system, an audio reproducing device (e.g., a car audio or an audio component set), a laptop computer, an image reproducing device provided with a recording medium (typically a device for reproducing a recording medium such as a digital versatile disc (DVD) and having a display for displaying the reproduced image), and the like can be given. Specific examples of these electronic devices are shown in FIGS. 17A to 17C.

Figure 17A:
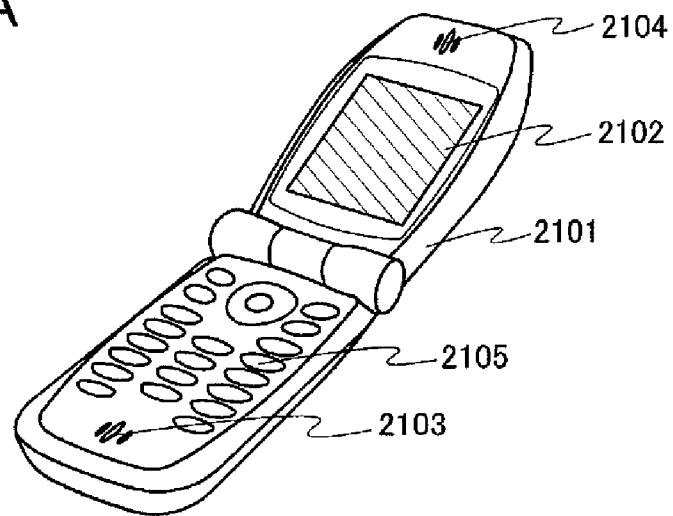
FIGS. 17A to 17C each illustrates an electronic device using a display device of the present invention.

FIG. 17A shows a mobile phone, which includes a main body 2101, a display portion 2102, an audio input portion 2103, an audio output portion 2104, and operation keys 2015. When the display device of the present invention is used for the display portion 2102, a mobile phone which is capable of displaying clear images because of few variation in luminance is obtained.

Figure 17B:
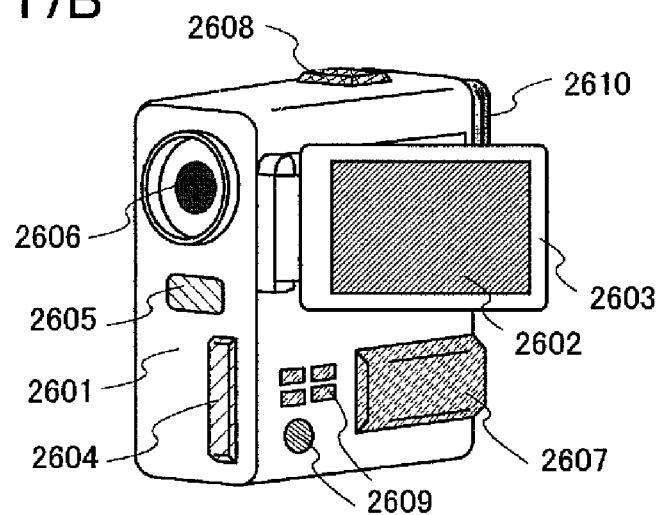

FIG. 17B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. When the display device of the present invention is used for the display portion 2602, a video camera which is capable of displaying clear images because of few variation in luminance is obtained.

Figure 17C:
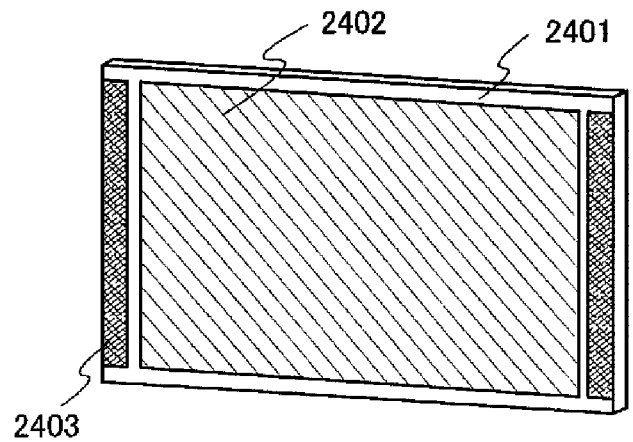

FIG. 17C is an image display unit which includes a housing 2401, a display portion 2402, a speaker portion 2403, and the like. When the display device of the present invention is used for the display portion 2402, an image display unit which is capable of displaying clear images because of few variation in a luminance is obtained. Note that the image display unit includes all devices for displaying image such as for a personal computer, for receiving TV broadcasting, and for displaying an advertisement, or the like.

As described above, an application range of the present invention is extremely wide and the present invention can be applied to electronic devices in various fields.

This embodiment can be implemented in combination with any of the above-described embodiment modes or the above-described embodiments as appropriate.

This application is based on Japanese Patent Application serial no. 2007-171484 filed with Japan Patent Office on Jun. 29, 2007, the entire contents of which are hereby incorporated by reference.

What is claimed is:

1. A semiconductor device comprising:
   a transistor;
   a capacitor;
   a first switching device, a second switching device, and a third switching device;
   wherein a first terminal of the transistor is electrically connected to a first line,
   wherein a second terminal of the transistor is electrically connected to a first terminal of the third switching device,
   wherein a gate of the transistor is electrically connected to a second line through the second switching device, a first electrode of the capacitor, and the first terminal of the third switching device, and
   wherein a second electrode of the capacitor is electrically connected to a third line through the first switching device.

2. The semiconductor device according to claim 1, wherein the first line is applied a power supply potential.

3. The semiconductor device according to claim 1, wherein the second line is applied an initial potential.

4. The semiconductor device according to claim 1, wherein the third line is applied a potential of a video signal.

5. The semiconductor device according to claim 1, wherein a second terminal of the third switching device is electrically connected to a light emitting element.

6. The semiconductor device according to claim 1, wherein at least one of the first switching device, the second switching device, and the third switching device is a transistor.

7. A semiconductor device comprising:
   a transistor;
   a capacitor;
   a first switching device, a second switching device, a third switching device, and a fourth switching device;
   wherein a first terminal of the transistor is electrically connected to a first line,
   wherein a second terminal of the transistor is electrically connected to a first terminal of the third switching device and a first terminal of the fourth switching device,
   wherein a gate of the transistor is electrically connected to a second line through the second switching device, a first electrode of the capacitor, and a second terminal of the fourth switching device, and wherein a second electrode of the capacitor is electrically connected to a third line through the first switching device.

8. The semiconductor device according to claim 7, wherein the first line is applied a power supply potential.

9. The semiconductor device according to claim 7, wherein the second line is applied an initial potential.

10. The semiconductor device according to claim 7, wherein the third line is applied a potential of a video signal.

11. The semiconductor device according to claim 7, wherein a second terminal of the third switching device is electrically connected to a light emitting element.

12. The semiconductor device according to claim 7, wherein at least one of the first switching device, the second switching device, the third switching device and the fourth switching device is a transistor.

* * * * *